US006646296B2

(12) United States Patent
Horiuchi

(10) Patent No.: US 6,646,296 B2
(45) Date of Patent: Nov. 11, 2003

(54) SEMICONDUCTOR INTEGRATED CIRCUIT AND METHOD FOR MANUFACTURING THE SAME

(75) Inventor: Masatada Horiuchi, Koganei (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/216,443

(22) Filed: Aug. 12, 2002

(65) Prior Publication Data

US 2002/0195623 A1 Dec. 26, 2002

Related U.S. Application Data

(62) Division of application No. 09/743,238, filed as application No. PCT/JP99/03622 on Jul. 15, 1999, now Pat. No. 6,462,364.

(30) Foreign Application Priority Data

Jul. 6, 1998 (JP) ............................................. 10-189543

(51) Int. Cl.[7] ........................ H01L 29/76; H01L 29/94; H01L 31/062; H01L 31/113; H01L 31/119
(52) U.S. Cl. ........................................ 257/288; 257/350
(58) Field of Search ................................. 257/261, 262, 257/296, 288, 300, 347, 350

(56) References Cited

U.S. PATENT DOCUMENTS 5,674,763 A  * 10/1997 Sugiura et al. ............. 438/200

6,201,728 B1 *  3/2001 Narui et al. ................ 365/149
6,462,364 B1 * 10/2002 Horiuchi .................... 257/288

FOREIGN PATENT DOCUMENTS

| JP | 62-123823 | 6/1987 |
| JP | 62-254522 | 11/1987 |
| JP | 3-263369 | 11/1991 |

OTHER PUBLICATIONS

1994 International Electron Devices Meeting Papers, "A Dynamic Threshold Voltage MOSFET (DTMOS) for Ultra–Low Voltage Operation", pp. 809–812.

* cited by examiner

Primary Examiner—David Nhu
(74) Attorney, Agent, or Firm—Mattingly, Stanger & Malur, P.C.

(57) ABSTRACT

A semiconductor integrated circuit has a MOS transistor formed on an SOI substrate and a subsidiary transistor provided between a body node and a drain node of the MOS transistor and sharing a gate electrode with the MOS transistor, whereby the body potential of the MOS transistor is controlled by gate and drain potentials. Accumulated body charge in a non-conducting state in the semiconductor integrated circuit is extracted by a resistor formed between the body node and a source, whereby various phenomena caused by the floating body effect are eliminated. The threshold voltage of the MOS transistor can be made variable so as to follow a change in an input signal.

14 Claims, 23 Drawing Sheets

(a)

(b)

PRIOR ART

SEMICONDUCTOR INTEGRATED CIRCUIT AND METHOD FOR MANUFACTURING THE SAME

This is a divisional application of U.S. Ser. No. 09/743,238, filed Jan. 5, 2001 now U.S. Pat. No. 6,462,364, which is a 371 of PCT/JP99/03622 filed Jul. 15, 1999.

TECHNICAL FIELD

The present invention relates to a semiconductor integrated circuit. Semiconductor integrated circuits according to the present invention can be effectively applied to memories, electronic control units, and processor units that have such semiconductor integrated circuits as components.

BACKGROUND ART

A method of forming a MOS field effect transistor (hereinafter abbreviated to MOS) in a single crystalline semiconductor layer on an insulator is known as an SOI (Silicon On Insulator) MOS structure (hereinafter abbreviated to SOI·MOS) forming method. The MOS has a thick insulator directly thereunder, and therefore is characterized by its ability to reduce drain junction capacitance and signal line to substrate capacitance to about $\frac{1}{10}$ of those of conventional MOS. In addition, the MOS is insulated and separated from its supporting substrate, and therefore is also characterized by its ability to substantially eliminate drawback due to irradiation with α rays and latch up phenomena.

Also, as a technique for utilizing the characteristic of SOI·MOS regions of being insulated and separated from each other, there is a method of allowing threshold voltage of SOI·MOS to vary depending on applied gate voltage by electrically connecting a substrate and a gate electrode of the SOI·MOS with each other. This method is proposed in 1994 International Electron Devices Meeting papers p.809 under the title "A dynamic threshold voltage MOSFET (DTMOS) for ultra-low voltage operation." An example of a structure formed by this method is shown in an equivalent circuit diagram of FIG. 2(a) and a plan arrangement view of FIG. 3. According to the above method, a substrate 3 of SOI·MOS is connected to a gate electrode 6 outside of a channel region by a metallic interconnection 61 via connection holes 112 and 113. Therefore, body potential rises with increase in applied gate voltage. This results in a forward direction current between a source and a drain, and therefore properties of the transistor exhibit a punch through state, thus resulting in an increase in the current value. In n-channel SOI·MOS, such a state corresponds to a state in which a threshold voltage value is turned negative. When the applied gate voltage is lowered, the body potential decreases. Therefore, the threshold voltage value is turned positive, thus resulting in a decrease in the current value. According to the structure described above, in which the body potential is controlled so as to vary with gate potential, it is possible to achieve properties such that the gradient of dependence of source-drain current on gate voltage is smaller than a gradient value of conventional SOI·MOS. Thus, the structure as described above is characterized by a great current obtained even at a lower supplied voltage than that of a conventional structure.

For the purpose of solving problems with the structure shown in FIG. 2(a), there is proposed a method of inserting a diode between the gate and the substrate. The method is illustrated in FIG. 2(b).

The conventional methods illustrated in FIGS. 2(a) and 2(b) make use of a structure specific to SOI·MOS, in which its body region is completely isolated from the outside, in order to achieve lower operating voltage by controlling the body potential by some method or another. In the case of the structure with its body region completely isolated from the outside, so-called floating body effect is known as the greatest problem with the SOI·MOS. The floating body effect refers to the following phenomena. Minority carriers generated by a strong drain electric field are accumulated in the body because the minority carriers have no path to flow out of the body region. The carriers accumulated in the body cause variations in threshold voltage and also cause abnormal hump properties to appear in current-voltage properties.

According to the above-mentioned method, the body potential is fixed to the gate potential, and therefore the problems of floating body effect are also solved.

In the case of a semiconductor integrated circuit formed on a normal Si substrate, there is also a conceivable system in which well potential is made variable by using a control circuit, so that the threshold voltage value of a transistor in a well region is made variable. According to this system, the threshold voltage values of all transistors in the well region are changed in the same manner.

DISCLOSURE OF INVENTION

A first object of the present invention is to provide SOI·MOS that has variable threshold voltage properties and enables lower voltage operation while ensuring high speed operation.

A second object of the present invention is to solve various problems caused by floating body effect. The various problems caused by floating body effect are the greatest disadvantage of a semiconductor device using an SOI substrate. Specific examples of the problems caused by floating body effect are variations in threshold voltage, appearance of abnormal hump properties in current-voltage properties, and a decrease in source-drain breakdown voltage.

A third object of the present invention is to not only solve the above-mentioned problems but also ensure high density circuit integration.

A fourth object of the present invention is to provide a fabrication method in which the above-mentioned problems are solved by a simpler method.

Background of the objects will hereinafter be described.

The DTMOS mentioned above has a problem in that it is not suitable for greater current and higher speed operation. FIG. 2(a) shows an inverter structure formed by DTMOS techniques. In this structure, application of gate voltage results in a forward direction between a source and a substrate, thereby causing a fatal defect in that a current flows from a gate to the source. In addition, because of the forward direction between the source and the substrate, the gate voltage cannot essentially be raised beyond built-in potential (about 0.6 V) of a source junction. Therefore, when the structure is operated at a supplied voltage of more than 0.6 V, the driving current of the structure becomes lower, rather than greater, than that of a normal structure MOS. Thus, from viewpoints of higher current and higher speed operation, improvements in properties of the structure cannot be expected. This means that the structure will only waste power at a supplied voltage of more than 0.6 V.

FIG. 2(b) shows an example of an inverter in which consideration is given to measures to solve the problems of the DTMOS. In this example, it is possible to apply a gate voltage higher than the built-in potential of a source junction because of the presence of reverse-biased diodes. However, with this system, no effects can be expected from a viewpoint of eliminating floating body effect, which is known as the greatest problem of SOI·MOS. With this structure, it is not possible to extract carriers generated in the body by a strong drain electric field. This means that in the case of n-channel MOS, holes are accumulated in the body, whereas in the case of p-channel MOS, electrons are accumulated. The accumulated carriers cannot be extracted in a connection path to a gate because of the presence of the reverse-biased diodes. Thus, with this structure, it is not possible to solve problems specific to floating body effect such as variations in threshold voltage, decrease in breakdown voltage, and instability in high-frequency operation.

Moreover, the inverter structure shown in FIG. 2(b) has another problem. Specifically, this structure involves complication of circuit design and increase in occupied area, because the structure requires a new periphery circuit for control of transistors MP1 and MP2. When compared with a normal SOI·MOS, the DTMOS structure shown in FIG. 2(a) also has a problem of an additional occupied area for substrate to gate connection outside its channel region. However, the structure of FIG. 2(b) further increases its occupied area, and therefore has a disadvantage of more significantly lowering the degree of integration of an integrated circuit.

As another system for rendering threshold voltage variable, a well potential variable method is conceivable. This well potential variable method can be expected to be effective in achieving higher speed operation and lower power consumption as compared with a method in which well potential is not variable. However, with this method, it is not possible to effect individual control of threshold voltage of each transistor. The method has a disadvantage of being unable to reduce leakage current in some transistor sections disposed in a well even in a condition where, for example, the threshold voltage of the transistors is to be maintained at a high value and leakage current is to be reduced. This is because the threshold voltages of all transistors in the well are changed in the same manner. Thus, it is not possible to effect individual control of threshold voltage of each transistor. In order to solve the above problem, it is necessary to perform well isolation for each transistor and provide a well potential control circuit for each isolated well. However, this presents a problem that will hinder higher circuit integration. Another disadvantage with the well potential control method is that well to substrate capacitance is relatively large, and therefore it is difficult to control well potential at super high speed.

It is accordingly an object of the present invention to solve, in principle, the problem with the conventional structures shown in FIGS. 2(a) and 2(b), that is, the problem with the structures that have gate voltage-dependent variable threshold voltage properties but have a fatal shortening in that gate current flows into the source. According to the present invention, it is possible to provide SOI·MOS that has variable threshold voltage properties and enables low voltage operation.

It is another object of the present invention to provide SOI·MOS in which no limit is set on applied gate voltage conditions, and therefore a gate voltage higher than source built-in potential can be applied, and thus to provide a low power consumption semiconductor integrated circuit that can achieve higher driving current and super high speed operation even at a usual supplied voltage of more than 0.6 V.

A further object of the present invention is to solve the problem with the method of rendering threshold voltage variable for each well unit. According to the present invention, it is possible to raise the threshold voltages of all transistors in a non-conducting state and lower the threshold voltages in a conducting state. In addition, according to the present invention, it is possible to provide a super high speed and low power consumption integrated circuit suitable for higher circuit integration.

A further object of the present invention is to enable higher circuit integration. For example, the conventional structure shown in FIG. 2(a) requires an additional area for substrate to gate electrode connection. The conventional structure shown in FIG. 2(b) makes higher circuit integration more difficult than the structure of FIG. 2(b), because diodes and their control circuits are added.

A further object of the present invention is to provide an inexpensive semiconductor device to which a conventional circuit can be applied as it is, without the need for designing an additional control circuit for variable threshold voltage properties.

A further object of the present invention is to provide a semiconductor device of new structure in which floating body effect of SOI·MOS is eliminated by a simple fabrication method.

A further object of the present invention is to provide a method in which floating body effect of SOI·MOS can be completely eliminated only by conventional fabrication techniques, that is, inexpensive fabrication techniques without the need for developing new fabrication techniques.

An essential concept of the present invention is to set a single transistor to be a fundamental unit with a variable threshold voltage, and enable low power and super high speed operation without any need for essential modification to conventional circuit design methods. Therefore, in the present invention, it is desirable to use an SOI substrate, which is most suitable for isolating device substrates of transistors from each other.

Next, main aspects of the present invention disclosed in the present specification will be briefly described.

In the present specification, as relating to substrates, terms "device substrate" and "supporting substrate" are used. The "device substrate" refers to a semiconductor substrate on which a single unit semiconductor device, which will be described below, is mounted. The "supporting substrate" refers to a substrate supporting a semiconductor integrated circuit that comprises single unit semiconductor devices and has a specific function. In general, device substrates are mounted on a supporting substrate, whereby a semiconductor device is formed.

In aspects of the present invention described in the following (1) to (5), fundamental aspects of forming a single unit semiconductor device by using a plurality of semiconductor members are illustrated. By using "single unit semiconductor devices," various semiconductor integrated circuits having specific functions such as logic circuits and memories are formed.

(1) According to a first aspect of the present invention, there is provided a semiconductor integrated circuit comprising a first MOS field effect transistor of a first conduction type and a second MOS field effect transistor of the first conduction type which form a single unit semiconductor device; and a device substrate mounted with the single unit semiconductor device and isolated from other semiconductor devices; wherein a circuit configuration is formed by a semiconductor device group including at least the single unit semiconductor device, the second MOS field effect transistor including a gate electrode connected to a gate electrode of the first MOS field effect transistor; a drain connected to a drain of the first MOS field effect transistor; and a source connected both to a device substrate of the first MOSFET and a source of the first MOS field effect transistor via a resistor and a device substrate of the first MOS field effect transistor.

The single unit semiconductor device in this example is shown in FIG. 1(a).

(2) According to a second aspect of the present invention, there is provided a semiconductor integrated circuit comprising a MOS field effect transistor and a capacitor which form a single unit semiconductor device; and a device substrate mounted with the single unit semiconductor device and isolated from other semiconductor devices; wherein a circuit configuration is formed by a semiconductor device group including at least the single unit semiconductor device, the capacitor including one electrode connected to a gate electrode of the MOS field effect transistor; and another electrode connected to a source of the MOS field effect transistor via a resistor and a device substrate of the MOS field effect transistor.

The single unit semiconductor device in this example is shown in FIG. 12(a).

(3) According to a third aspect of the present invention, there is provided a semiconductor integrated circuit comprising a first MOS field effect transistor of a first conduction type, a second MOS field effect transistor of the first conduction type, and a third MOS field effect transistor of a second conduction type which form a single unit semiconductor device; and a device substrate mounted with the single unit semiconductor device and isolated from other semiconductor devices; wherein a circuit configuration is formed by a semiconductor device group including at least the single unit semiconductor device, the second MOS field effect transistor including a gate electrode connected to a gate electrode of the first MOS field effect transistor; and a drain connected to a device substrate of the first MOS field effect transistor; and the third MOS field effect transistor including a gate electrode connected to a gate electrode of the second MOS field effect transistor; a drain connected to a device substrate of the first MOS field effect transistor; and a source connected to a source of the first MOS field effect transistor.

The single unit semiconductor device in this example is shown in FIG. 18(a).

(4) According to a fourth aspect of the present invention, there is provided a semiconductor integrated circuit according to the third aspect, wherein the third MOS field effect transistor is of the first conduction type; and the gate electrode of the third transistor is connected to a drain of the first MOS field effect transistor.

(5) According to fifth to eighth aspects of the present invention, there is provided a semiconductor integrated circuit according to the first to fourth aspects, wherein the semiconductor device is isolated from a supporting substrate of the semiconductor integrated circuit by an insulator, and is isolated from another semiconductor device by an insulator.

The following aspects (6) to (10) of the present invention will describe forms of CMOS.

(6) According to a ninth aspect of the present invention, there is provided a semiconductor integrated circuit comprising a supporting substrate having at least a first substrate region and a second substrate region electrically isolated from each other; a first MOS field effect transistor and a second MOS field effect transistor which form the first substrate region; and a third MOS field effect transistor and a fourth MOS field effect transistor which form the second substrate region; wherein a single unit semiconductor device is formed by at least the first to fourth MOS field effect transistors; and a circuit configuration is formed by a semiconductor device group including at least the single unit semiconductor device, the second MOS field effect transistor including a gate electrode connected to a gate electrode of the first MOS field effect transistor; a drain connected to a drain of the first MOS field effect transistor; and a source connected to a source of the first MOS field effect transistor via a first resistor and a device substrate of the first MOS field effect transistor; and the fourth MOS field effect transistor including a gate electrode connected to a gate electrode of the third MOS field effect transistor; a drain connected to a drain of the third MOS field effect transistor; and a source connected to a source of the third MOS field effect transistor via a second resistor and a device substrate of the third MOS field effect transistor.

This example is shown in FIG. 1(b).

(7) According to a tenth aspect of the present invention, there is provided a semiconductor integrated circuit comprising a supporting substrate having at least a first substrate region and a second substrate region electrically isolated from each other; a first MOS field effect transistor of a first conduction type and a first capacitor which form the first substrate region; and a second MOS field effect transistor of a second conduction type and a second capacitor which form the second substrate region; wherein a single unit semiconductor device is formed by at least the first and second MOS field effect transistors and the first and second capacitors; and a circuit configuration is formed by a semiconductor device group including at least the single unit semiconductor device, the first capacitor including one electrode connected to a gate electrode of the first MOS field effect transistor; and another electrode connected to a source of the first MOS field effect transistor via a first resistor and a device substrate of the first MOS field effect transistor; and the second capacitor including one electrode connected to a gate electrode of the second MOS field effect transistor; and another electrode connected to a source of the first MOS field effect transistor via a second resistor and a device substrate of the first MOS field effect transistor.

This example is shown in FIG. 12(b).

(8) According to an eleventh aspect of the present invention, there is provided a semiconductor integrated circuit comprising a supporting substrate having at least a first substrate region and a second substrate region electrically isolated from each other; a first MOS field effect transistor of a first conduction type, a second MOS field effect transistor of the first conduction type, and a third MOS field effect transistor of a second conduction type which form the first substrate region; and a fourth MOS field effect transistor of the second conduction type, a fifth MOS field effect transistor of the second conduction type, and a sixth MOS field effect transistor of the first conduction type which form the second substrate region; wherein a single unit semiconductor device is formed by at least the first to sixth MOS field effect transistors; and a circuit configuration is formed by a semiconductor device group including at least the single unit semiconductor device, the second MOS field effect transistor including a gate electrode connected to a gate electrode of the first MOS field effect transistor; a drain connected to a drain of the first MOS field effect transistor; and a source connected to a device substrate of the first MOS field effect transistor, the second MOS field effect transistor sharing a device substrate with the first MOS field effect transistor; the fourth MOS field effect transistor including a gate electrode connected to a gate electrode of the first MOS field effect transistor; and a drain connected to a drain of the first MOS field effect transistor; and the fifth MOS field effect transistor including a gate electrode connected to a gate electrode of the first MOS field effect transistor; a drain connected to a device substrate of the fourth MOS field effect transistor; and a source connected to a source of the fourth MOS field effect transistor.

This example is shown in FIG. 18(b).

(9) According to a twelfth aspect of the present invention, there is provided a semiconductor integrated circuit according to the eleventh aspect, wherein the third MOS field effect transistor is of the first conduction type and has a gate electrode connected to the drain of the first transistor; and the sixth MOS field effect transistor is of the second conduction type and has a gate electrode connected to the drain of the first transistor.

(10) According to thirteenth to sixteenth aspects of the present invention, there is provided a semiconductor integrated circuit according to the ninth to twelfth aspects, wherein the semiconductor device is isolated from the supporting substrate of the semiconductor integrated circuit by an insulator, and is isolated from another semiconductor device by an insulator.

Applications of the present invention to NAND or NOR circuits will be illustrated in the following.

(11) According to a seventeenth aspect of the present invention, there is provided a semiconductor integrated circuit comprising a plurality of sets of first MOS field effect transistors of a first conduction type and second MOS field effect transistors of the first conduction type which correspond to a plurality of input nodes, one of the first MOS field effect transistors and one of the second MOS field effect transistors together forming one set and having gate electrodes connected to one input node; wherein a group of the first transistors in the sets of the transistors share a body node to form a first series connection; and a group of the second transistors in the sets of the transistors share a body node to form a second series connection, one end of each of the first and second series connections being connected to an output node, another end of the first series connection being connected to a power supply node, and another end of the second series connection being connected to the body node and the power supply node via a resistor, whereby a portion of a NAND type gate circuit or a NOR type gate circuit is formed.

(12) According to an eighteenth aspect of the present invention, there is provided a semiconductor integrated circuit according to the second aspect or the sixth aspect, wherein a plurality of semiconductor devices are connected in series with each other to form a series connection, one end of the series connection being connected to an output node and another end of the series connection being connected to a power supply node, whereby a portion of a NAND type gate circuit or a NOR type gate circuit is formed.

(13) According to a nineteenth aspect of the present invention, there is provided a semiconductor integrated circuit according to the seventeenth aspect, wherein the resistor is replaced with a third MOS field effect transistor of a second conduction type, and a gate electrode of the third transistor is connected to one input node.

(14) According to a twentieth aspect of the present invention, there is provided a semiconductor integrated circuit according to the nineteenth aspect, wherein the third transistor is replaced with a third TMOS field effect transistor of a first conduction type, and a gate electrode of the third MOS field effect transistor is connected to an output node.

(15) According to a twenty-first aspect of the present invention, there is provided a semiconductor integrated circuit according to the seventeenth aspect, wherein the resistor and a plurality of the groups of the transistors sharing device substrate nodes to form series connections are isolated from a supporting substrate of the semiconductor integrated circuit by an insulator, and are isolated by an insulator from another semiconductor device which does not share the device substrate nodes.

(16) According to twenty-second to twenty-fourth aspects of the present invention, there is provided a semiconductor integrated circuit according to the eighteenth to twentieth aspects, wherein the semiconductor devices are isolated from a supporting substrate of the semiconductor integrated circuit by an insulator, and are isolated from each other by an insulator.

(17) According to a twenty-fifth aspect of the present invention, there is provided a semiconductor integrated circuit comprising a first MOS field effect transistor; and a second MOS field effect transistor and a third MOS field effect transistor each having a gate electrode connected to a gate electrode of the first MOS field effect transistor, the second transistor including a source and a drain connected to a source and a body node of the first transistor, respectively, and the third transistor including a source and a drain connected to the body node and a drain of the first transistor, respectively.

(18) According to a twenty-sixth aspect of the present invention, there is provided a semiconductor integrated circuit comprising a first MOS field effect transistor of a first conduction type; and a second transistor and a third transistor each of a second conduction type and respectively controlled by a source and a drain of the first MOS field effect transistor, the second transistor including a source connected to the source of the first transistor via a first resistor; and a drain connected to a body node of the first transistor; and the third transistor including a source connected to the body node of the first transistor; and a drain connected to the drain of the first transistor via a second resistor.

(19) According to a twenty-seventh aspect of the present invention, there is provided a semiconductor integrated circuit according to the twenty-sixth aspect, wherein a capacitor is added between a gate electrode and the body node of the first transistor.

(20) According to a twenty-eighth aspect of the present invention, there is provided a semiconductor integrated circuit according to the preceding aspects, wherein the resistor is formed in a semiconductor thin film.

(21) According to a twenty-ninth aspect of the present invention, there is provided a semiconductor integrated circuit according to the preceding aspects, wherein the resistor is formed in a single crystalline semiconductor layer in which a transistor is formed.

(22) According to a thirtieth aspect of the present invention, there is provided a semiconductor integrated circuit according to the preceding aspects, wherein the resistor has a resistance value of 500 kΩ or less and 1 kΩ or more.

(23) According to a thirty-first aspect of the present invention, there is provided a semiconductor integrated circuit according to the first, fifth, seventeenth, and twenty-first aspects, wherein an absolute value of threshold voltage of the second transistor is set lower than an absolute value of threshold voltage of the first transistor.

(24) According to a thirty-second aspect of the present invention, there is provided a semiconductor integrated circuit according to the third, fourth, seventh, eighth, nineteenth, twentieth, and twenty-third to twenty-fifth aspects, wherein absolute values of threshold voltages of the second transistor and the third transistor are set lower than an absolute value of threshold voltage of the first transistor.

(25) According to a thirty-third aspect of the present invention, there is provided a semiconductor integrated circuit according to the ninth and thirteenth aspects, wherein absolute values of threshold voltages of the second transistor and the fourth transistor are set lower than absolute values of threshold voltages of the first transistor and the third transistor.

(26) According to a thirty-fourth aspect of the present invention, there is provided a semiconductor integrated circuit according to the eleventh, twelfth, fifteenth, and sixteenth aspects, wherein absolute values of threshold voltages of the second transistor, the third transistor, the fifth transistor, and the sixth transistor are set lower than absolute values of threshold voltages of the first transistor and the fourth transistor.

(27) According to a thirty-fifth aspect of the present invention, there is provided a semiconductor integrated circuit according to the first, fifth, seventeenth, and twenty-first aspects, wherein channel width of the second transistor is ⅕ or less of channel width of the first transistor.

(28) According to a thirty-sixth aspect of the present invention, there is provided a semiconductor integrated circuit according to the third, fourth, seventh, eighth, nineteenth, twentieth, and twenty-third to twenty-fifth aspects, wherein channel widths of the second transistor and the third transistor are ⅕ or less of channel width of the first transistor.

(29) According to a thirty-seventh aspect of the present invention, there is provided a semiconductor integrated circuit according to the ninth and thirteenth aspects, wherein channel widths of the second transistor and the fourth transistor are ⅕ or less of channel widths of the first transistor and the third transistor.

(30) According to a thirty-eighth aspect of the present invention, there is provided a semiconductor integrated circuit according to the eleventh, twelfth, fifteenth, and sixteenth aspects, wherein channel widths of the second transistor, the third transistor, the fifth transistor, and the sixth transistor are ⅕ or less of channel widths of the first transistor and the fourth transistor.

(31) According to a thirty-ninth aspect of the present invention, there is provided a semiconductor integrated circuit according to the twenty-ninth aspect, wherein the resistor is formed in a single crystalline semiconductor layer between source and drain junctions of a MOS field effect transistor and a buried insulator.

The following aspect of the present invention relates to a fabrication method.

(32) According to an aspect of the present invention, there is provided a fabrication method comprising the steps of forming a gate electrode on a principal surface of a single crystalline semiconductor layer of a first conduction type isolated from a supporting substrate by a thick insulator with a thin insulator intermediate between the gate electrode and the principal surface of the single crystalline semiconductor layer; forming a shallow diffusion layer of a second conduction type with the gate electrode serving as a mask; forming a deep source or drain diffusion layer of the second conduction type in a section of a region where the shallow diffusion layer is formed so as not to allow a bottom of a source or drain junction to reach the thick insulator; creating holes whose bottoms reach the thick insulator in a section of the single crystalline semiconductor layer where only the shallow diffusion layer is formed and in a section of the single crystalline semiconductor layer where the deep diffusion layer is formed; and forming conductive layers in the holes and thereby short-circuiting a region of the first conduction type and a region of the second conduction type.

The deep diffusion layer forms a source or a drain. In the present invention, it is important to form the deep diffusion layer so as not to allow the bottom of a junction formed by the deep diffusion layer to reach the thick insulator. A resistance RS formed at the bottom of the source diffusion layer plays a principal role in the present invention. By such a simple method, it is possible to form a structure in which a resistor is buried under the source diffusion layer.

Incidentally, the resistor (RS) may be provided externally of a semiconductor device according to the present invention. However, according to the method disclosed in the above aspect of the present invention, it is possible to form a buried structure by a simple method. This method is extremely useful as a fabrication method and from characteristic and practical points of view.

The following aspects (33) to (36) of the present invention will describe specific applications of semiconductor integrated circuits according to the present invention to various semiconductor devices, such as memories, transfer mode systems, and processor units.

(33) According to a forty-first aspect of the present invention, two pairs of semiconductor integrated circuits according to any of the ninth to sixteenth aspects form a single unit memory.

(34) According to a forty-second aspect of the present invention, there is provided a semiconductor integrated circuit according to any one of the twenty-fifth to twenty-seventh aspects, wherein one node of a MOS field effect transistor is connected with a capacitor, whereby a single unit memory is formed.

(35) According to a forty-third aspect of the present invention, a semiconductor integrated circuit according to any one of the first to thirty-eighth aspects forms an asynchronous transfer mode system.

(36) According to a forty-fourth aspect of the present invention, a semiconductor integrated circuit according to any one of the first to thirty-eighth aspects and a semiconductor integrated circuit according to any one of the first to thirty-fourth aspects form a processor unit.

(37) According to a forty-fifth aspect of the present invention, there is provided a semiconductor integrated circuit according to any one of the first, second, fifth, sixth, seventeenth, twenty-first, and twenty-sixth aspects, wherein the resistor is formed by a resistive functional device having linear or nonlinear properties, and a resistance value of the resistor is set higher than on resistance of a first transistor.

(38) According to a forty-sixth aspect of the present invention, there is provided a semiconductor integrated circuit according to any one of the ninth, tenth, thirteenth, and fourteenth aspects, wherein the resistor is formed by a resistive functional device having linear or nonlinear properties, and a resistance value of the resistor is set higher than on resistances of a first transistor and a third transistor.

(39) According to a forty-seventh aspect of the present invention, there is provided a semiconductor integrated circuit according to any one of the second, sixth, tenth, fourteenth, eighteenth, and twenty-second aspects, wherein a relation between source-drain current (IDS) of a transistor, a resistance value (RS) of a resistor, a capacitance value (CG) of a capacitor, and driven load capacitance (CL) is set such that a product of CG, RS, and ISD is equal to or greater than CL

(40) According to a forty-eighth aspect of the present invention, there is provided a semiconductor integrated circuit according to the forty-seventh aspect, wherein a product of CG and RS is equal to or greater than a reciprocal number of an operating frequency.

(41) Semiconductor integrated circuits according to the aspects of the present invention and other semiconductor integrated circuits can be connected in series, in parallel, or in series-parallel with each other and used in a desired manner according to the purpose. It is to be understood that in such a case, the semiconductor integrated circuits according to the aspects of the present invention retain their characteristics and effects.

[Operation Principles of Fundamental Structure of the Invention]

Operation principles of a fundamental structure of the present invention will be described. The fundamental structure is provided according to the foregoing first aspect of the present invention. In addition to explanation of the fundamental structure, an example of a complementary type semiconductor integrated circuit formed by using the fundamental structure will be described. These structures are mentioned in the foregoing sections (1) and (9).

The fundamental structure will be described with reference to a circuit diagram of FIG. 1(a). FIG. 1(a) is a circuit diagram of an n-channel MOS (abbreviated to nMOS). A control transistor M2 is inserted between a body node and a drain of a transistor M1 whose threshold voltage is to be made variable, and a resistor RS is inserted between the body node and a source of the transistor M1. A gate electrode of the transistor M2 is connected to a gate electrode of the transistor M1. Threshold voltage values of the transistors M1 and M2 are set to be positive values; however, it is desirable that the former be set at a normal value, and the latter be set at a value in the vicinity of 0 V. Channel width of the transistor M2 may be ⅕ or less, or preferably ⅒ or less, of channel width of the transistor M1.

In the structure of FIG. 1(a), when a positive voltage is applied to the gate of the transistor M1 so as to bring the transistor M1 into a conducting state, the transistor M2 is also brought into a conducting state. In this case, body potential of M1 is obtained by dividing drain voltage by a resistance of the transistor M2 in a conducting state and the resistance RS. When the resistance RS is set higher than on resistance of the control transistor M2, or at a few k$\Omega$ or higher, the body potential of M1 becomes substantially equal to the drain voltage. The increase in the body potential of M1 causes the threshold voltage of the transistor to change in a negative direction, thereby resulting in an increase in source-drain current.

When the drain voltage is more than 0.6 V, which is a built-in potential of the p-n junction, there occurs a new current path from the drain to a source diffusion layer in a forward-direction state via the body nodes of the transistors M2 and M1. However, this current does not have any adverse effects since the current flows only when the transistor M1 is in a conducting state and functions in such a manner as to further increase drain current. When a gate voltage is applied so as to bring the transistor M1 into a non-conducting state, the transistor M2 is also brought into a non-conducting state, and therefore the body node of M1 is cut off from an output node.

At this point, the resistor RS plays an important role in the present invention. Specifically, without the resistor RS, the non-conducting state of the transistor M2 causes a floating state in the body node of M1, and therefore various problems caused by floating body effect cannot be solved. By setting a resistance value of the resistor RS to a few M$\Omega$ or lower, body charge can be quickly extracted to the source node in a short time constant of picoseconds or less, thereby eliminating floating body effect. It is more desirable to set the resistance value of the resistor RS to 1 M$\Omega$ or lower.

[Prevention of Increase in Occupied Area and Fabrication Method]

It is not desirable from a viewpoint of higher circuit integration if arrangement of the resistor RS causes an increase in occupied area. In the present invention, the resistor RS is formed at the bottom of the source diffusion layer of the transistor M1 within the same SOI substrate that includes the transistors M1 and M2. This is intended to prevent an increase in occupied area and variations in properties due to difference in thermal coefficients.

Connection between the resistor RS and the M1 source node is realized by creating a hole also in the SOI layer in making a source connection hole so as to allow the hole to reach a buried insulator, filling the hole with an interconnection metal, and thereby short-circuiting the SOI substrate region and the source diffusion layer.

The resistance value of the resistor RS is determined by impurity concentration and thickness of a residual SOI region between the bottom of the source diffusion layer of M1 and the buried insulator, and width from an end of a source junction to an end of the source connection hole. Thus, junction depths of the source and drain diffusion layers need to be controlled precisely, and therefore attention should be directed to the following. There are so-called channeling phenomena in which at the time of ion implantation, impurities are aligned with a crystal lattice, and thus implanted deeper than a range determined by ion implantation energy. An abnormally extended low-concentration distribution resulting from the channeling phenomena poses a serious problem in controlling junction depth.

As methods for accurately forming a residual SOI region where the resistor RS is to be provided, (1) a tilt ion implantation method and (2) high-temperature treatment in a short time are employed in the present invention. Specifically, the tilt ion implantation method is carried out by setting a tilt angle of implantation for forming source and drain diffusion layers of the transistor M1 at 10 to 30 degrees with respect to a direction perpendicular to the single crystalline SOI layer. Activation of implanted ions through high-temperature treatment in a short time prevents not only abnormal spread of implanted ions resulting from channeling phenomena but also occurrence of transient enhance diffusion effect of implanted ions. By employing the tilt ion implantation method and the short-time high-temperature treatment, source and drain diffusion layers having a steep concentration distribution with a reduced low-concentration region are formed. Thus, it is possible to form a residual SOI layer of 10 nm or more at the bottom of a source diffusion layer in a well controlled manner.

In a symmetric source/drain structure, a resistance region as formed under the bottom of the source diffusion layer of the transistor M1 is similarly formed under the bottom of a drain diffusion layer. Since the resistance region is connected to a drain electrode via a drain connection hole, there is a fear of occurrence of a punch through path in which the substrate and the drain are short-circuited via the bottom portion of the drain diffusion layer irrespective of gate voltage. In order to prevent such a short circuit, impurity concentration, residual SOI thickness, and width of the bottom of the drain diffusion layer are set in such a manner that a substrate region at the bottom of the drain diffusion layer is completely depleted by application of drain voltage. In order to prevent occurrence of a punch through path at the bottom portion of the drain diffusion layer by using a drain depletion layer, the width of the bottom of the drain diffusion layer may be set at 100 nm or more under conditions of a applied drain voltage of 2 V, a residual SOI film thickness of 20 nm, and a substrate concentration of $1\times10^{17}/cm^3$, for example. Under such conditions, drain leakage current can be controlled to $10^{-14}$ A/$\mu$m or less, which is practically a negligible current value. Under the same conditions, by setting the width of the bottom of the source diffusion layer at 100 nm or more at a substrate potential of 0.5 V, it is possible at all times to realize a structure in which the resistor RS is buried under the bottom of the source diffusion layer.

It should be noted that the present invention is applicable to both nMOS and p-channel MOS (hereinafter abbreviated to pMOS). Also, there are conceivable modifications of the fundamental structure in which the transistor M2 is replaced with a capacitor, or the resistor RS is replaced with a transistor MN2, for example. Such modifications can also provide the same effects in terms of operating properties as described above. More specific description of the modifications will be made in a section of embodiments of the present invention.

[Application to Complementary Type Transistor]

FIG. 1(b) is an example of application of the present invention to a complementary type transistor (CMOS). In this example, the fundamental structure of the nMOS shown in FIG. 1(a) is also applied to pMOS by changing only the conduction type of the nMOS. With a circuit configuration of FIG. 1(b), it is possible to achieve low voltage and great current operation of pMOS without causing floating body phenomena by rendering its threshold voltage variable. Therefore, it is possible to realize SOI·CMOS capable of low voltage and high speed operation.

In an integrated circuit having the structure of the present invention, since threshold voltage of a transistor is made variable so as to follow change in gate voltage, its drain current rapidly rises even in a condition of low applied gate voltage, and therefore a significant effect of achieving greater current is obtained. In this example, as the gate voltage of the transistor is increased, its body potential also rises and the drain current increases without causing the problem of gate leakage current. The maximum drain current is generally defined by a current component obtained on the basis of punch through properties in the properties of the transistor, and an amount of increase in the absolute value of the current is limited.

For lower voltage operation, if the threshold voltage of a conventional transistor is set low, the same effect as described above can be obtained. A fundamental difference between the structure of the present invention and a conventional transistor with a low threshold voltage value is that the structure of the present invention can reduce leakage current to the same level attained by a conventional transistor with a high threshold voltage value.

The above-described method of eliminating the floating body effect of SOI·MOS according to the present invention can be realized only by combining conventional semiconductor fabrication methods, and therefore does not require development of new fabrication techniques. Therefore, according to the present invention, it is possible to provide a semiconductor device capable of low voltage and super high speed operation at low cost.

BEST MODE FOR CARRYING OUT THE INVENTION

Figure 1:
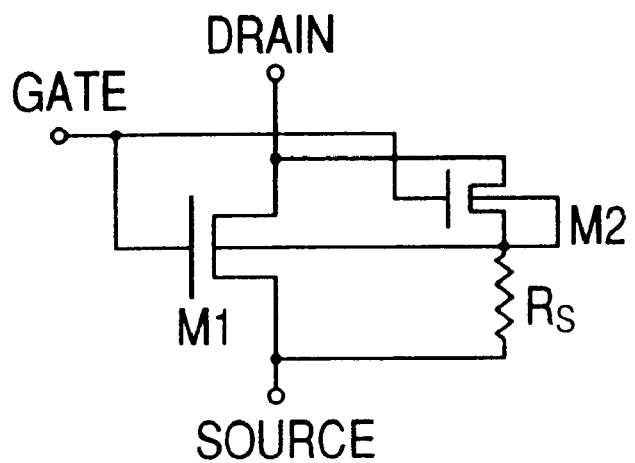
FIGS. 1(a) and 1(b) are circuit configuration diagrams of semiconductor integrated circuits according to a first embodiment and a second embodiment of the present invention.
Figure 1:
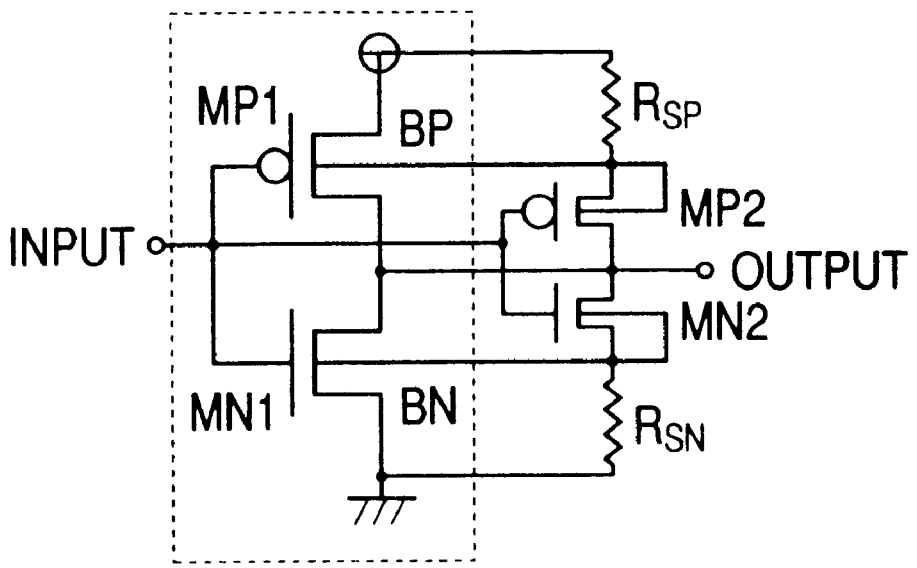
Figure 2:
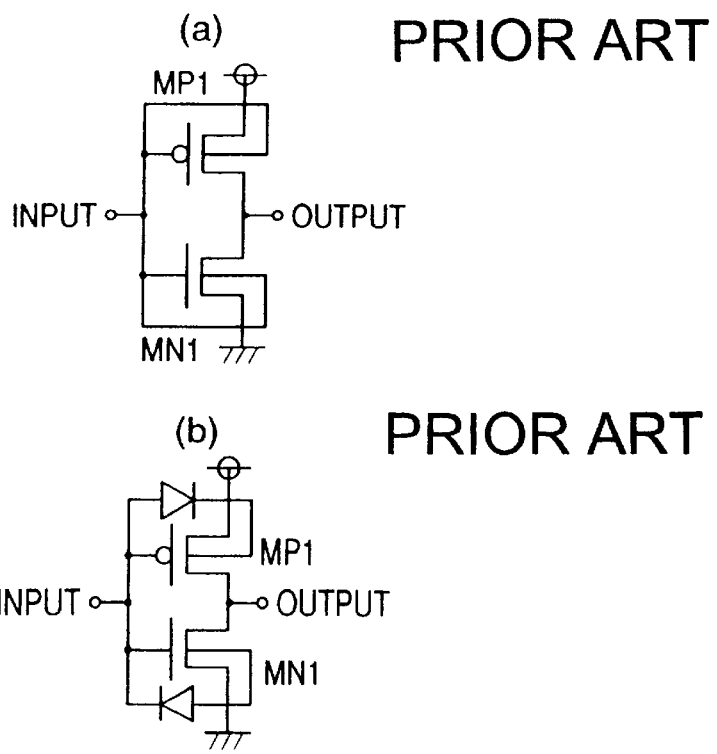
FIGS. 2(a) and 2(b) are circuit configuration diagrams of conventional semiconductor integrated circuits.
Figure 3:
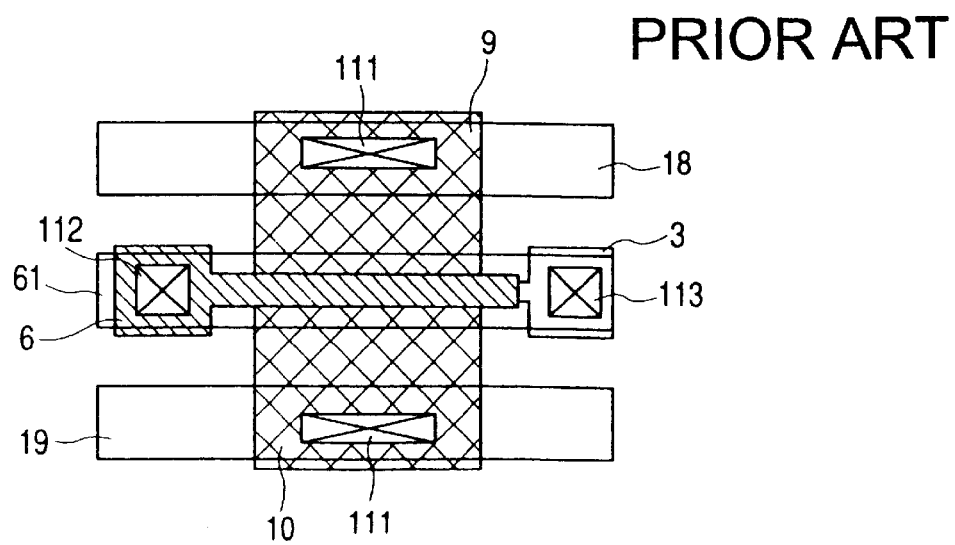
FIG. 3 is a plan arrangement view of a conventional semiconductor integrated circuit.

The present invention will hereinafter be described in more detail by reference to embodiments thereof. It should be noted that in the drawings, important parts are shown in more enlarged dimension than other parts in order to facilitate understanding. It is to be understood that materials, conduction types, fabrication conditions and the like of respective parts are not limited to those described in this section of preferred embodiments, and it is possible to make many modifications thereof.

First Embodiment

Figure 4:
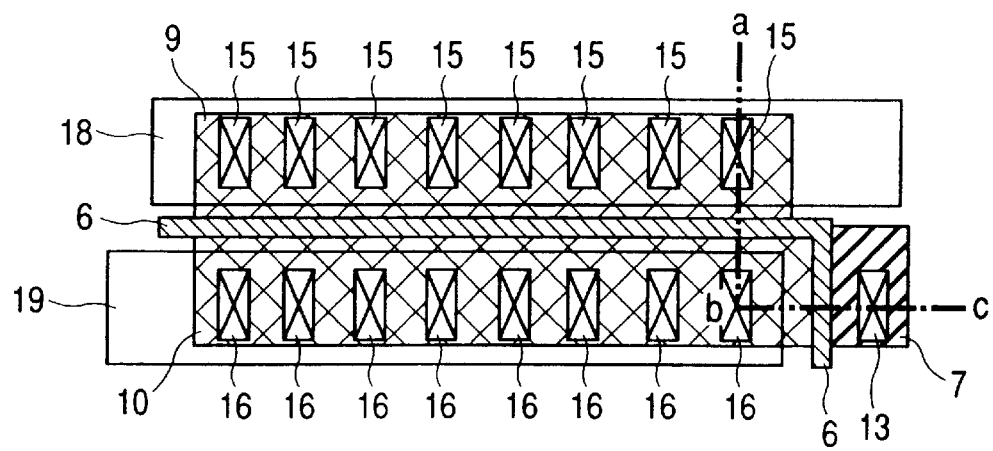
FIG. 4 is a plan view of a completed semiconductor integrated circuit according to the first embodiment of the present invention.
Figure 5:
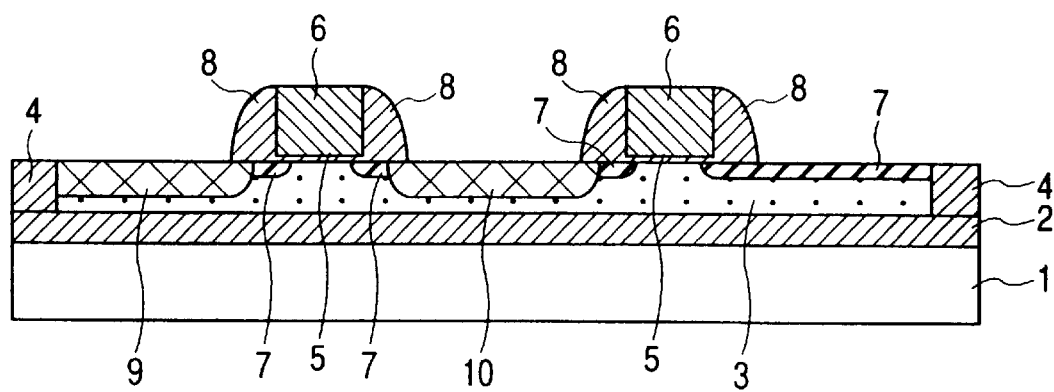
FIG. 5 is a sectional view of the semiconductor integrated circuit according to the first embodiment of the present invention for explaining its fabrication process in the order of process steps.
Figure 6:
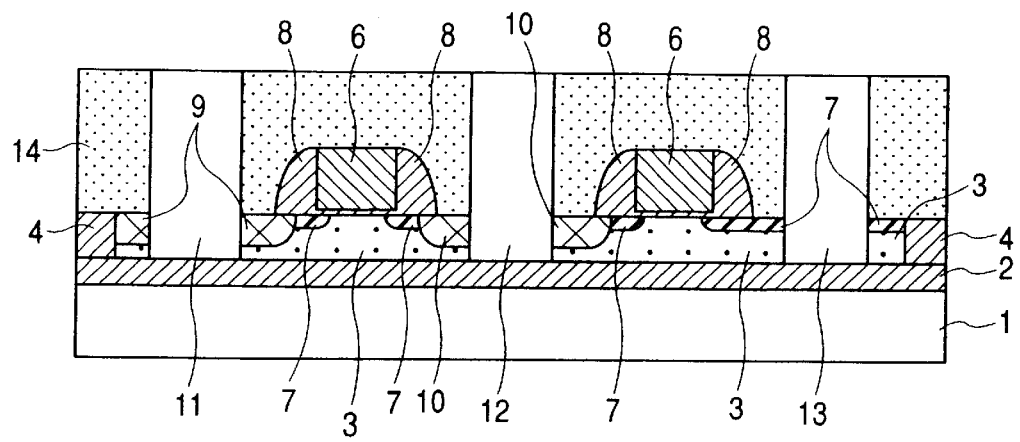
FIG. 6 is a sectional view of the semiconductor integrated circuit according to the first embodiment of the present invention for explaining its fabrication process in the order of process steps.
Figure 7:
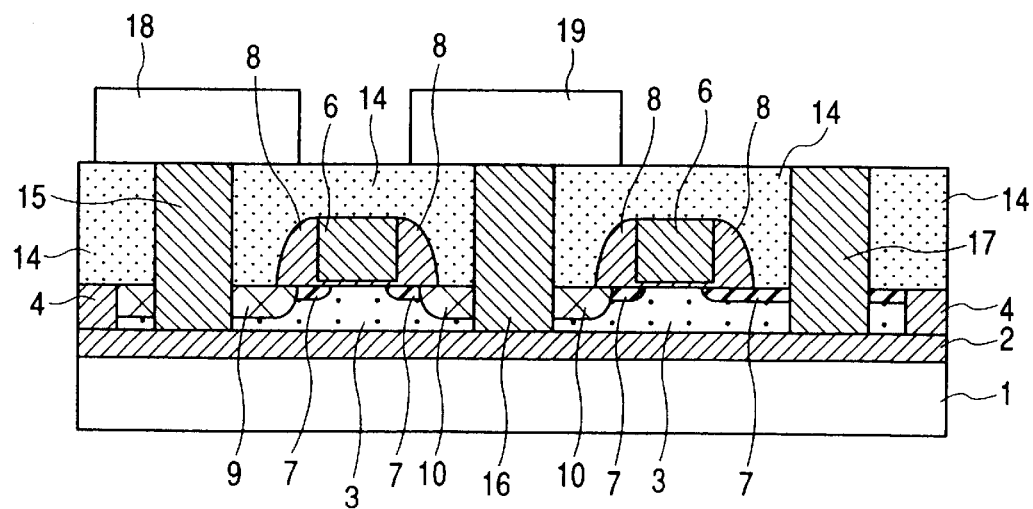
FIG. 7 is a sectional view of the semiconductor integrated circuit according to the first embodiment of the present invention.

FIG. 1(a) is a circuit configuration diagram of a semiconductor integrated circuit according to a first embodiment of the present invention. FIG. 4 is a plan view of a completed semiconductor integrated circuit according to the first embodiment. FIGS. 5 to 7 are sectional views of the semiconductor integrated circuit for explaining its fabrication process in the order of process steps. It should be noted that sectional views of FIGS. 5 to 7 are taken along a line abc in FIG. 4.

An SOI supporting substrate is prepared by mounting a silicon oxide layer (referred to simply as an oxide layer) 2 with a thickness of 400 nm and a p-conduction type (100) plane crystal plane single crystalline Si layer (hereinafter referred to as SOI layer) 3 with a thickness of 150±2 nm and an impurity concentration of $1\times10^{17}/cm^3$ on a supporting substrate 1 with a diameter of 20 cm formed by single crystalline Si. The SOI layer in a region other than an active region on the SOI substrate is selectively removed, and a field insulator 4 is selectively deposited in the same region where the SOI layer is selectively removed. This processing can be performed adequately by a known method. Then, the principal surface of the SOI supporting substrate thus prepared is flattened by a known mechano-chemical polishing method. Boron (B) ions are selectively implanted into the active region on the SOI supporting substrate in this state except a region where a transistor M2 is to be formed. In this case, the amount of ions implanted is adjusted in such a manner that the threshold voltage value of a transistor M1 ultimately becomes 0.5 V.

A gate oxide layer 4 nm in thickness and a 150-nm thick low resistive silicon film highly doped with phosphorus are thereafter formed on a surface of the SOI layer 3. Then, the low resistive silicon film is subjected to patterning in accordance with a desired circuit configuration to thereby form a gate electrode 6. In this state, a first As ion implantation is performed from over the gate electrode 6. In this case, the gate electrode 6 is situated at a position corresponding to an implantation stopping mask. The above ion implantation is performed under set conditions of an acceleration energy of 5 keV and an ion dose of $1\times10^{15}/cm^2$. In order to activate implanted ions, thermal treatment is then performed at a temperature of 950° C. and for a short time period of five seconds, and shallow n-type source and drain diffusion layers 7 are formed.

Next, a silicon oxide deposition film 100 nm in thickness is deposited on the entire surface of the semiconductor substrate prepared by the process described thus far. A side wall insulator 8 is selectively allowed to remain on a side wall of the gate electrode by asymmetric etching of the silicon oxide film. In this state, a region except that of the transistor M1 is selectively covered with a resist film, and then a second As ion implantation is performed under the following conditions: an acceleration energy of 40 keV, an ion dose of $2 \times 10^{15}/cm^2$, and a tilt angle of implantation of 10 degrees with respect to a direction perpendicular to the SOI substrate. Next, activation thermal treatment for implanted ions is performed at a temperature of 950° C. and for a time period of five seconds to thereby form a deep source diffusion layer 9 and a deep drain diffusion layer 10 (FIG. 5).

Samples subjected to thermal treatment under conditions according to a fabrication process of the first embodiment are created, and junction depth of the deep source and drain diffusion layers 9 and 10 is measured. As a result, in these samples, channeling phenomena, which are observed in junction formation by a common ion implantation method, have been greatly reduced. Specifically, the junction depth of the deep source and drain diffusion layers at which $2 \times 10^{17}/cm^3$ is reached is 100 nm, and therefore it is possible to achieve a very steep impurity distribution. Thus, the single crystalline Si layer 3 remaining as a p-conduction type under the source and drain junctions of the semiconductor device according to the first embodiment is 30 nm in thickness. The impurity concentration of the single crystalline Si layer 3 remaining as a p-conduction type may be set to a desired concentration by using an ion implantation method or the like. A reduction in the thickness of the SOI layer 3 due to cleaning treatment at some point in the fabrication process is also included in calculation of the thickness of the remaining SOI layer.

A resistor is formed by allowing substrate material to remain as a thin layer on the side of the device substrate formed of silicon, using the ion implantation in the above process. In the case of arsenic, the impurity concentration is generally decreased from $10^{21}$ cm$^{-3}$ to $10^{17}$ cm$^{-3}$ by such a method. For a resistor, an impurity concentration of less than $10^{17}$ cm$^{-3}$ is desirable. The resistor may also be formed by a desired counter ion implantation.

A gate protection insulator 14 is deposited on the whole surface of the semiconductor substrate in a state as shown in FIG. 5, and a hole 13 for source and drain connection is provided in the gate protection insulator 14. Then, the surface of the SOI layer is made to be exposed at a bottom of the hole 13. After creation of the hole in the gate protection insulator 14, holes 11, 12, and 13 are created in the SOI layer 3 under the gate protection insulator 14. The etching of the SOI layer is performed with the buried oxide layer 2 serving as an end point of the etching. In the transistor of the first embodiment, intervals between ends of the gate electrodes and the holes 11, 12, and 13 are set at 200 nm (FIG. 6).

A laminated layer 15 formed by titanium nitride (TiN) films 20 nm in thickness and tungsten (W) films 50 nm in thickness is selectively deposited in the holes 11, 12, and 13 of the semiconductor substrate in a state as shown in FIG. 6. Incidentally, a detailed laminated state of the laminated layer is not shown in FIG. 7. The laminated layer 15 of TiN films and W films allows the source diffusion layer 9 and the remaining SOI substrate region under the source diffusion layer to be electrically connected to each other. The entire surface of the semiconductor substrate in this state is coated with an interconnection metallic film including Al as its main material, and then patterning is performed in accordance with a desired circuit configuration to form electrodes including a source electrode 18 and a drain electrode 19 and interconnections (FIG. 7).

A plan view and a circuit configuration diagram of the semiconductor integrated circuit according to the first embodiment fabricated through the above-described fabrication process are shown in FIG. 4 and FIG. 1(*a*), respectively. It should be noted that in FIG. 4, the transistor M2 is represented by a region that is formed only by an extending region of the deep drain diffusion layer 10, the bending gate electrode 6, and the shallow n-type diffusion layer 7. In the sectional view of FIG. 7, the transistor M2 corresponds to the right half of the transistor section. Incidentally, reference numerals in the plan view of FIG. 4 denote parts as in the corresponding sectional views.

As is clear from the sectional view, a positive voltage is applied to the gate electrode 6 of the transistor M2, and thus the transistor M2 is in a conducting state with the transistor M1 also in a conducting state. A drain potential is applied from the drain diffusion layer 10 to the SOI substrate 3 thereunder via a channel of the transistor M2 and the shallow n-type source diffusion layer 7. An SOI substrate region under the source of the transistor M2 is connected to an SOI substrate region of the transistor M1 via the SOI layer under the gate electrode of the transistor M2. Therefore, when the transistors M1 and M2 are conducting, a drain voltage up to built-in potential is applied to a body node of the transistor M1.

In the semiconductor integrated circuit according to the first embodiment, all the problems caused by floating body effect, which is a fatal problem with conventional SOI transistors, are solved. Specifically, (1) the source-to-drain withstand voltage of the transistor of the first embodiment is 5.7 V. As compared with a conventional SOI-MOS structure of the same size, the source-to-drain withstand voltage of the transistor is improved by 2.5 V. As a result, it is possible to provide the semiconductor substrate of the transistor the same withstand voltage characteristics as those of MOS of the same size fabricated in accordance with a usual method. (2) Also in current-voltage characteristics of the transistor, abnormal hump properties called kink properties are not observed, and the transistor exhibits normal properties. (3) The gradient or the subthreshold coefficient of dependence of source-drain current on the gate voltage is 62 mV per order of magnitude of change in the current, which is sufficiently small as compared with the value 80 mV per order of magnitude of change in the current in the case of a conventional SOI-MOS structure of the same gate size. (4) Also in relation to the dependence of source-drain current on the gate voltage, presence of leakage current at a low gate voltage, which is observed in a conventional SOI-MOS structure, is not observed in the semiconductor integrated circuit according to the first embodiment. In addition, dependence of the threshold voltage value on drain voltage, which is observed in a conventional SOI-MOS structure, is not observed in the semiconductor device according to the first embodiment. The fact that such leakage current is not observed shows that presence of a drain substrate connection path at the bottom of the drain diffusion layer 10 does not adversely affect characteristics of the transistor because of the action of a drain depletion layer. It is clear from the characteristics described above that the semiconductor device according to the first embodiment is completely free from various characteristics resulting from floating body effect observed in a conventional SOI·MOS structure.

Second Embodiment

Figure 8:
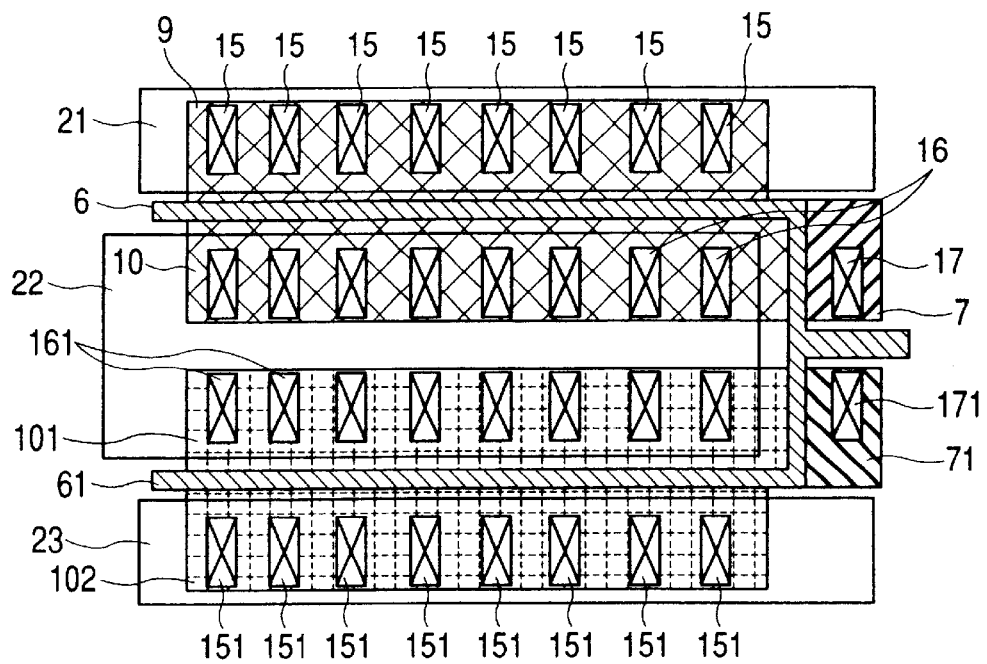
FIG. 8 is a plan view of the semiconductor integrated circuit according to the second embodiment of the present invention.
Figure 9:
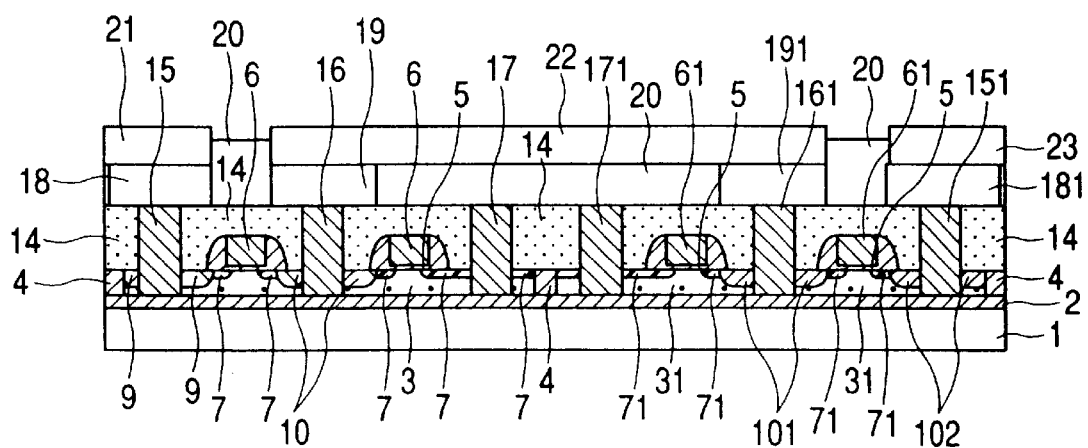
FIG. 9 is a sectional view of the semiconductor integrated circuit according to the second embodiment of the present invention.
Figure 10:
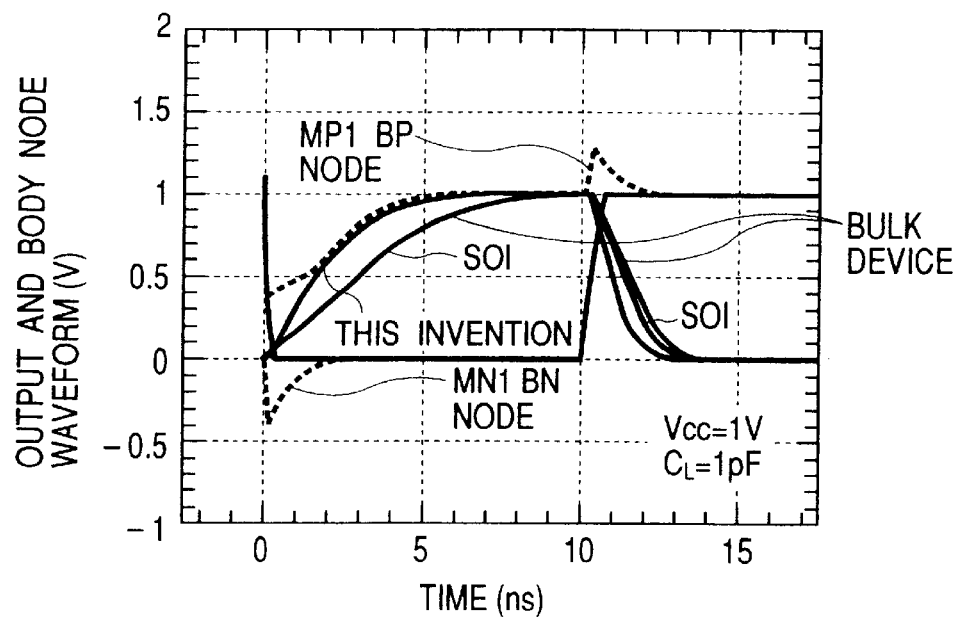
FIG. 10 shows dynamic output properties obtained by the semiconductor integrated circuit according to the second embodiment of the present invention.
Figure 11:
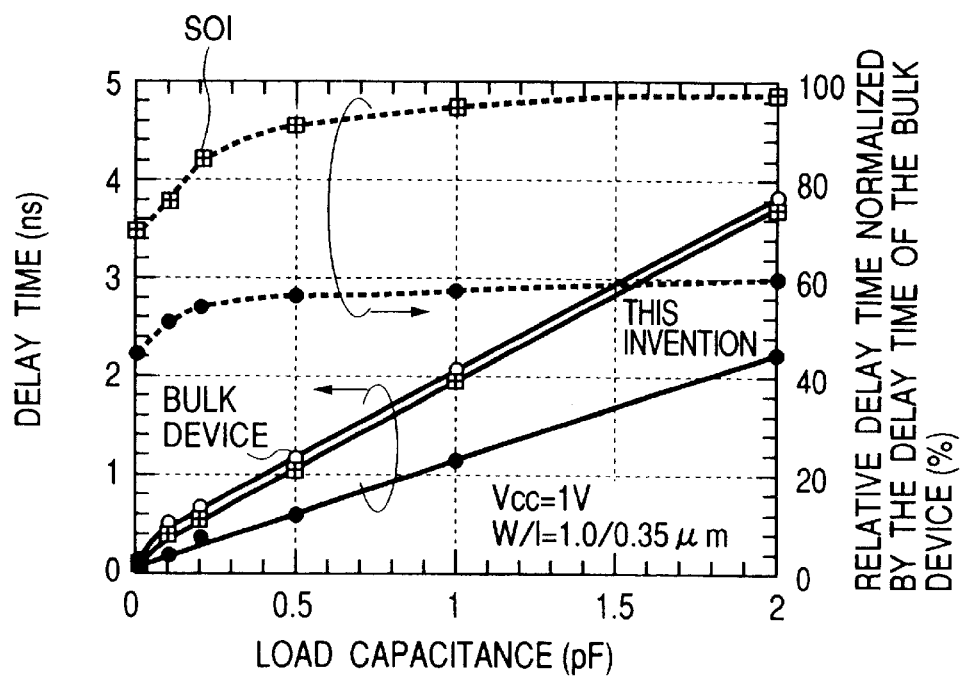
FIG. 11 shows delay time properties obtained by the semiconductor integrated circuit according to the second embodiment of the present invention.

FIG. 8 is a plan view of a completed semiconductor integrated circuit according to a second embodiment of the present invention. FIG. 9 is a sectional view of the semiconductor integrated circuit, and FIG. 1(b) is a circuit configuration diagram of the semiconductor integrated circuit. FIGS. 10 and 11 show dynamic output properties and delay time properties, respectively, obtained by the semiconductor integrated circuit according to the second embodiment.

The second embodiment is an example of a semiconductor integrated circuit having a function as a CMOS inverter. A fundamental fabrication method of the second embodiment is the same as that of the first embodiment described above; however, process steps for forming CMOS are added to the fabrication method.

The fabrication process will now be described with reference to FIGS. 8 and 9. A modification only for formation of pMOS is made to the fabrication process, and a fundamental fabrication method of the second embodiment is the same as that of the first embodiment described above.

A field insulator 4 as in the foregoing first embodiment is formed according to a desired circuit configuration. Phosphorus (P) ions are selectively implanted into a region of an SOI layer 3 for forming pMOS, whereby this region is converted into an n-type SOI layer 31. Then, phosphorus (P) or boron (b) ions for control of threshold voltage are implanted, as desired, into a transistor MP1 region and a transistor MN1 region. Thereafter, as in the fabrication method of the foregoing first embodiment, a fabrication process to a step of forming an nMOS gate electrode 6 is carried out. At this point, a pMOS gate electrode 61 is formed simultaneously with the formation of the nMOS gate electrode 6.

After the formation of the gate electrodes 6 and 61, $BF_2$ ions are implanted into the pMOS region with the gate electrode 61 serving as a stopping mask, while As ions are selectively implanted into the nMOS region. Conditions for implantation of $BF_2$ ions are an acceleration energy of 3 keV and an ion dose of $1\times10^{15}/cm^2$, while conditions for implantation of As ions are an ion dose of $2\times10^{15}/cm^2$ and an acceleration energy of 5 keV. Next, thermal treatment is performed at a temperature of 900° C. and for a short time period of five seconds to thereby form a shallow p-type highly concentrated diffusion region 71 and a shallow n-type highly concentrated diffusion region 7 in the pMOS region and the nMOS region, respectively.

In this state, a gate side wall insulator 8 is formed under the same conditions as those in the foregoing first embodiment, and then a source region and a drain region are formed. Specifically, As ions are selectively implanted into the nMOS region, and $BF_2$ ions are selectively implanted into the pMOS region. Conditions for implantation of As ions are an acceleration energy of 40 keV, an ion dose of $2\times10^{15}/cm^2$, and a tilt angle of implantation of 20°, while conditions for implantation of $BF_2$ ions are an acceleration energy of 5 keV and an ion dose of $2\times10^{15}/cm^2$. Then, a second thermal treatment is performed at a temperature of 900° C. and for a short time period of five seconds to thereby form an n-type source diffusion layer 9, an n-type drain diffusion layer 10, a p-type drain diffusion layer 101, and a p-type source diffusion layer 102, which are formed by a deep highly concentrated diffusion region.

Then, by the same method as that of the foregoing first embodiment, deposition of a gate protection insulator 14, creation of holes at desired locations, etching of the SOI layers 3 and 31 in the holes are performed, and laminated metallic layers 15, 16, 17, 151, 161, and 171 are selectively formed in the holes. Further, an interconnection protection insulator 20 is deposited and connection holes are formed at desired locations. Metallic interconnections including an earth potential line 18, an output signal line 22, and a supplied voltage line 23 are provided according to a desired circuit configuration (FIG. 9).

In the plan view shown in FIG. 8, M2-forming transistors are provided in one end of the device. The transistors may be provided in both ends of the device in the plan view.

[Function of CMOS Inverter]

The semiconductor integrated circuit according to the second embodiment has a function as a CMOS inverter. FIG. 10 shows output properties of the inverter. For comparison, FIG. 10 also shows output properties of inverters having gate electrodes of the same size and fabricated on normal Si and SOI substrates (curves denoted by a bulk device and SOI respectively in FIG. 10). The pMOS transistor MP1 and the nMOS transistor MN1 both have a gate width of 0.35 µm, and a gate length of 10 µm. The gate width and the gate length of MP2 and MN2 are 0.5 µm and 0.35 µm, respectively. The threshold voltage values of MN1 and MP1 are set at 0.56 V and −0.56 V, respectively, and the threshold voltage of MN2 and MP2 is set at 0 V.

In addition, for reference, FIG. 10 also shows a potential waveform of a body node BP of MP1 (a curve denoted by MP1 node BP in FIG. 10) and a potential waveform of a body node BN of MN1 (a curve denoted by MN1 node BN in FIG. 10).

These properties are measured by placing a single-stage inverter in a stage before the inverter to be measured and using its output as an input to the inverter to be measured. The input to the inverter to be measured has a waveform such that it falls from 1 V to 0 V in 0 ns, and rises from 0 V to 1 V from 10 ns on. The supply voltage (Vcc) is 1 V, and the load capacitance (CL) is 1 pF. In a process in which voltage at an input node of the inverter to be measured falls from 1 V to 0 V and then MP1 goes into a conducting state and MN1 goes into a non-conducting state, MP2 also goes into a conducting state and MN2 goes into a non-conducting state. Thus, the potential of the body node BP of MP1 is lowered from 1 V to 0.4 V by the output potential of the single-stage inverter. At this point in time, the potential of the body node BN of MN1 is also lowered to a negative potential. This means that the threshold voltages of MP1 and MN1 change in such a manner that a current flowing through MP1 is made larger, and leakage current is further reduced by the non-conducting state of MN1. As a result, in accordance with the output properties of the inverter according to the second embodiment, it is possible to obtain rapid rising properties as compared with conventional inverters fabricated on normal Si and SOI substrates.

Although this is not directly related to the present invention, the rising properties of the conventional inverters fabricated on normal Si and SOI substrates seem to be substantially the same, but to be exact, the inverter fabricated on the SOI substrate displays a more rapid rising property by about 5%.

In a process in which voltage at the input node of the inverter to be measured rises from 0 V to 1 V and then MN1 goes into a conducting state and MP1 goes into a non-conducting state, MN2 also goes into a conducting state and MP2 goes into a non-conducting state. Thus, the potential of the body node BN of MN1 is raised from 0 V to 0.6 V by the output potential of the single-stage inverter. At this point in time, the potential of the body node BP of MP1 is also raised to a potential of more than 1 V. Thus, the threshold voltages of MP1 and MN1 change in such a manner that a current flowing through MN1 is made larger, and leakage current is further reduced by the non-conducting state of MP1. As a result, in accordance with the output properties of the inverter according to the second embodiment, it is possible to obtain rapid rising properties as compared with conventional inverters fabricated on normal Si and SOI substrates. Even under a condition where a large load capacitance of 1 pF is to be driven, according to the inverter of the second embodiment, it is possible to achieve high speed and high driving power properties with only an about 5% increase in occupied area per channel width, which results from addition of MN2 and MP2.

Incidentally, in a circuit to which resistors RSN and RSP according to the second embodiment are not added, its body node potentials as shown in FIG. 10 are not changed so as to follow change in output potential of a single-stage inverter, resulting in very long time constant properties at the lowering or raising of the output potential of the single-stage inverter. Thus, the body node potentials cannot change so as to follow change in input waveform. It is conceivable from this result that the body potential is in a floating state, and therefore is in a state in which the body potential cannot be controlled arbitrarily.

FIG. 11 shows a more quantitative comparison of output properties of the inverter according to the second embodiment with properties of conventional inverters fabricated on normal Si and SOI substrates. The properties of the inverter according to the second embodiment are denoted by a dotted black curve line. In FIG. 11, the axis of ordinates denotes delay time, and the axis of abscissas denotes load capacitance. The delay time is determined from an average of rising time and falling time of FIG. 10. As is clear from FIG. 11, according to the inverter of the second embodiment, its delay time is in proportional relation to its load capacitance, and the delay time can be reduced to 60% or less regardless of the load capacitance as compared with the delay time of the conventional inverter fabricated on the normal Si substrate. In addition, an inverter without load capacitance reduces its circuit delay time and fundamental delay time to about 40% as compared with the conventional inverter fabricated on the normal Si substrate. This represents a significant improvement.

Third Embodiment

Figure 12:
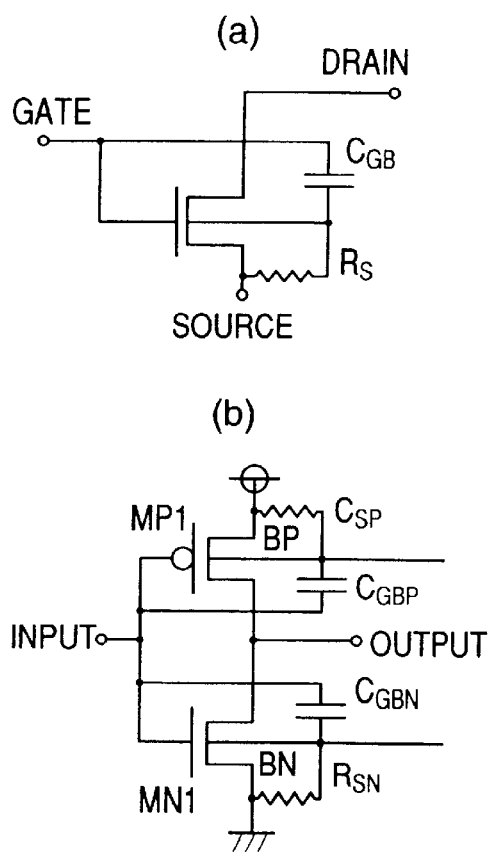
FIGS. 12(a) and 12(b) are circuit configuration diagrams of semiconductor integrated circuits according to a third embodiment and a fourth embodiment of the present invention.
Figure 13:
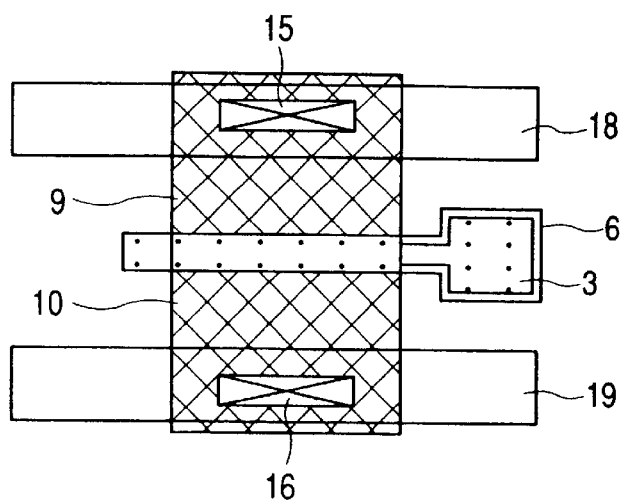
FIG. 13 is a plan view of the semiconductor integrated circuit according to the third embodiment of the present invention.
Figure 14:
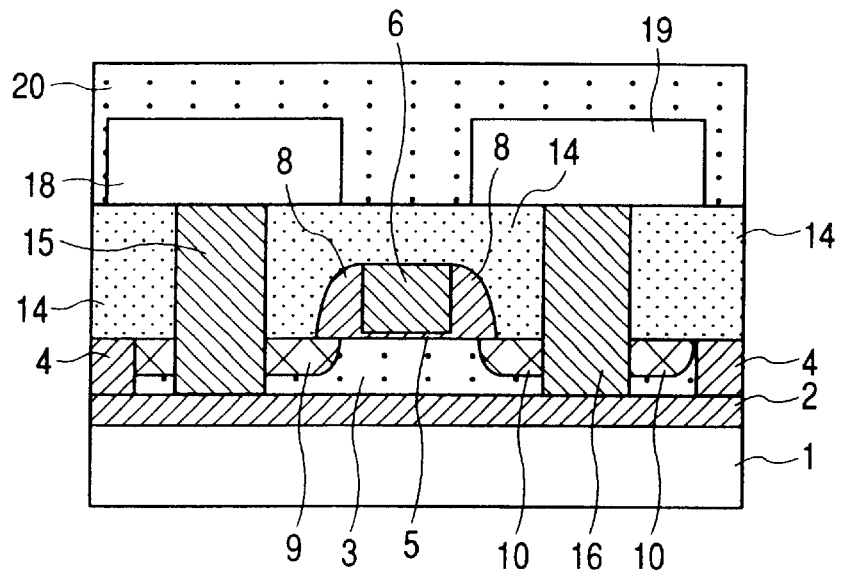
FIG. 14 is a sectional view of the semiconductor integrated circuit according to the third embodiment of the present invention.

FIG. 12(a) is a circuit configuration diagram of a semiconductor integrated circuit according to a third embodiment of the present invention. FIG. 13 is a plan view of the completed semiconductor integrated circuit, and FIG. 14 is a sectional view of the completed semiconductor integrated circuit. It should be noted that FIG. 13 shows only main parts, and reference numerals in the plan view of FIG. 13 denote parts as in the corresponding sectional view of FIG. 14.

The third embodiment is an example of a semiconductor integrated circuit without the transistor M2 of the first embodiment. This semiconductor integrated circuit has a capacitor instead of the transistor M2. More specifically, the semiconductor integrated circuit is provided with a capacitor having one electrode connected to a gate electrode of a first transistor and the other electrode connected a source of the first transistor via a body node of the first transistor and a first resistor.

Basically, the semiconductor integrated circuit of the third embodiment is fabricated according to the fabrication method of the first embodiment. Part of a gate electrode 6 is extended to form a capacitor CG with part of an active region of an SOI layer 3. In order to form this capacitor, in the third embodiment, B ions are selectively implanted into part of the active region before the process of forming a gate insulator 5 in the first embodiment, and a highly concentrated region 6 of the same conduction type as the SOI layer 3 is formed. The fabrication process thereafter is carried out according to the first embodiment.

The capacitor is provided to add an effect of making body potential rise or fall following such change in gate potential, and therefore is not intended to change direct current properties of the transistor. From a viewpoint of allowing the body potential to sufficiently follow change in input waveform, in a condition in which a resistor RS has 1 MΩ or less, a capacitance value of 10 fF or less is desirable. Also in a channel region of the transistor, body to gate capacitance is added in principle, but the body to gate capacitance is formed by capacitance of the gate insulator and that of a depletion layer arranged in series with each other. Therefore, the body to gate capacitance has an effect of making body potential change so as to follow change in gate input potential, but the capacitance value mentioned above cannot be set regardless of the direct current properties of the transistor. Thus, in the third embodiment, in parallel with the gate capacitance component of the transistor, a capacitor formed by the highly concentrated p-type diffusion layer, the gate insulator, and the gate electrode is provided separately. In order to obtain a capacitance value of 10 fF, it suffices to provide a 1-$\mu m^2$ active region for a 3.5-nm gate insulator.

The transistor fabricated according to the third embodiment exhibits completely identical direct current properties to those of the transistor fabricated according to the first embodiment. In the case of the transistor fabricated according to the third embodiment, phenomena caused by floating body effect, which are observed in a conventional SOI transistor, are not observed at all. In addition, the gradient or the subthreshold coefficient of dependence of source-drain current on the gate voltage is 62 mV per order of magnitude of change in the current in a measurement with a 10-ns wide pulse, which value is sufficiently small as compared with the value 80 mV per order of magnitude of change in the current in the case of a conventional SOI·MOS structure of the same gate size. In direct current measurement, the transistor exhibits exactly the same properties as those of a conventional SOI·MOS structure. Thus, the structure of the third embodiment exerts great effects only in improvement of transient properties.

Fourth Embodiment

Figure 15:
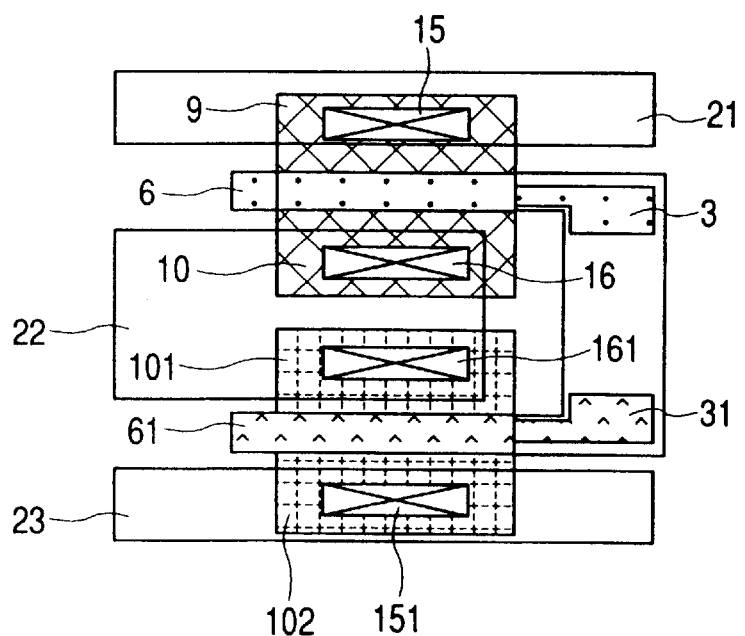
FIG. 15 is a plan view of the semiconductor integrated circuit according to the fourth embodiment of the present invention.
Figure 16:
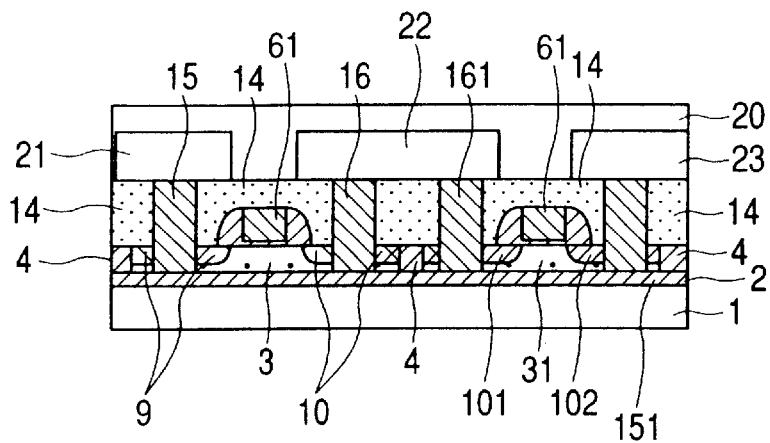
FIG. 16 is a sectional view of the semiconductor integrated circuit according to the fourth embodiment of the present invention.
Figure 17:
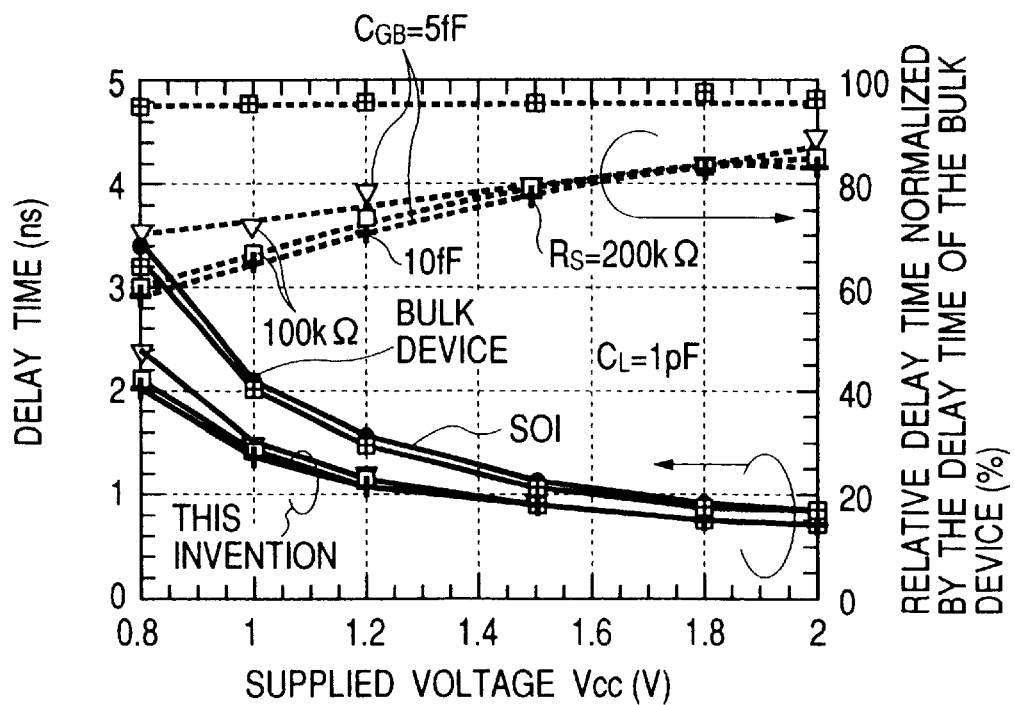
FIG. 17 shows delay time properties obtained by the semiconductor integrated circuit according to the fourth embodiment of the present invention.

FIG. 12(b) is a circuit configuration diagram of a semiconductor integrated circuit according to a fourth embodiment of the present invention. FIG. 15 is a plan view of the completed semiconductor integrated circuit, and FIG. 16 is a sectional view of the completed semiconductor integrated circuit. FIG. 17 shows delay time properties of an inverter circuit provided by the semiconductor integrated circuit according to the fourth embodiment. It should be noted that reference numerals in the plan view of FIG. 15 denote parts as in the corresponding sectional view of FIG. 16.

The fourth embodiment is an example of CMOS provided with capacitors instead of the transistors MN of the second embodiment.

The semiconductor integrated circuit of the fourth embodiment is fabricated according to the method of the second embodiment. In order to form the capacitors mentioned above, the following process is adopted in the fourth embodiment. Before the process of forming a gate insulator 5 in the second embodiment, (1) B ions are selectively implanted into part of an nMOS active region, and a highly concentrated region 6 of the same conduction type as an SOI layer 3 is provided. (2) An n-type highly concentrated region formed by selective P ion implantation into part of a pMOS active region is provided in an n-type SOI layer 31. A fundamental fabrication process thereafter is carried out according to the process of the second embodiment.

FIG. 17 shows properties of an inverter of the semiconductor integrated circuit according to the fourth embodiment. In FIG. 17, the axis of ordinates denotes delay time of the inverter determined from an average of CMOS inverter time and falling time, and the axis of abscissas denotes supplied voltage. Load capacitance CL is 1 pF. In the fourth embodiment, the resistance values of RS and the capacitance values of CGB are set at 100 kΩ and 200 kΩ, and 5 fF and 10 fF, respectively. In accordance with the delay properties of the inverter according to the fourth embodiment, it is possible to obtain short delay time properties as compared with conventional inverters fabricated on normal Si and SOI substrates. The delay time can be made shorter as compared with the conventional inverters as the supplied voltage is lowered. In quantitative terms, the inverter of the fourth embodiment reduces its delay time to 8% of delay time of the conventional inverter on a normal Si substrate at a supplied voltage of 2 V, and 60% of delay time of the conventional inverter on a normal Si substrate at a supplied voltage of 0.8 V. For comparison, when an example of the inverter on an SOI substrate is considered, delay time of the conventional inverter on an SOI substrate is not dependent on supplied voltage at a large load capacitance of 1 pF, and is reduced to only about 95% of delay time of the inverter on a normal Si substrate.

In the inverter according to the fourth embodiment, capacitors CGBP and CGBN have an effect of making body potential rise or fall following such change in gate input potential and thereby making threshold values transiently variable. A time constant that defines such transient change is determined by a product of RSN and CGBN in nMOS and a product of RSP and CGBP in pMOS. Effects of such transient change on characteristics of direct current operation such as maximum current value are not observed. As for dynamic properties of the inverter, when resistance values or capacitance values are too high, it is not possible to make the body potential change following a change in input in the input process, and it results in instability such as variation in delay time that is dependent on a used frequency. The capacitance value that will not cause instability is about 2 to 10 fF when the resistance RS is 1 MΩ or less. In order to obtain a capacitance value of 10 fF, it suffices to provide a 1-μm² active region for a 3.5-nm gate insulator. This means that an increase in area occupied by the inverter according to the fourth embodiment required for short delay time properties can be controlled to only less than 10%.

It should be noted that in the fourth embodiment, resistances RSN and RSP are essential for control of the body potential in both transient operation and direct current operation. Also in channel regions of the transistors, body to gate capacitance is added in principle, but the body to gate capacitance is formed by gate capacitance and depletion capacitance arranged in series with each other. Therefore, the body to gate capacitance has an effect of making the body potential change so as to follow change in gate input potential, but the capacitance value mentioned above cannot be set regardless of the direct current properties of the inverter. Thus, the capacitors CGBN and CGBP disposed in parallel with the capacitance components of the transistors and having no effect on the direct current properties of the inverter are essential especially in the structure of the fourth embodiment for realizing high load driving power.

In the fourth and third embodiments, in order to achieve low-voltage, high-speed operation by effectively controlling the body potential, the following relation needs to be maintained between a capacitor, a resistor, and a fundamental transistor. A body potential control time constant CG·RS product (or CGN·RSN and CGP·RSP products) is set to be greater than a load driving time constant obtained by dividing load capacitance CL to be driven by a source-drain current IDS of the transistor. This condition is intended to render the high-speed operating function more effective by setting the time during which the body potential is controlled longer than switching time. In addition, it is required that the CG·RS product (or CGN·RSN and CGP·RSP products) be smaller than a reciprocal of an operating frequency, that is, operating time. This is because when the body potential control time constant CG·RS product (or CGN·RSN and CGP·RSP products) is greater than a reciprocal of an operating frequency, some history will be present at the next switching input.

Fifth Embodiment

Figure 18:
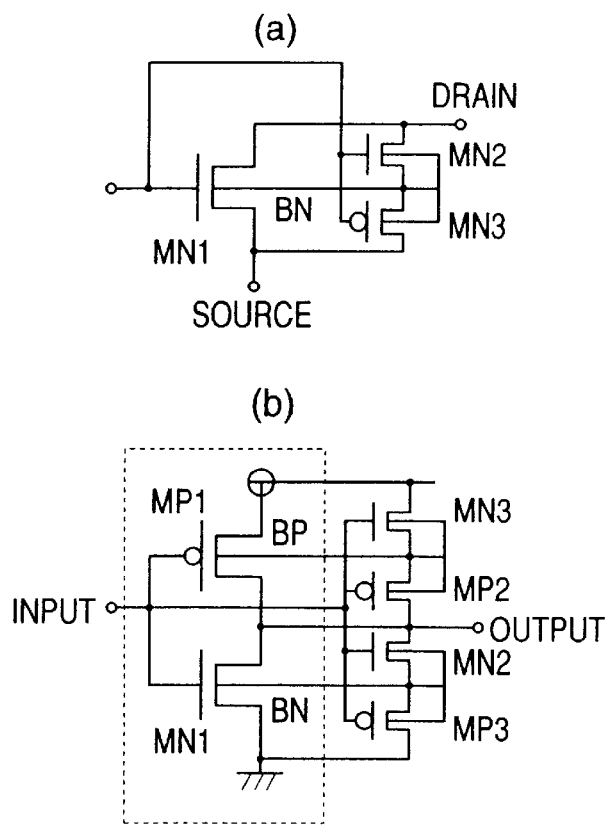
FIGS. 18(a) and 18(b) are circuit configuration diagrams of semiconductor integrated circuits according to a fifth embodiment and a sixth embodiment of the present invention.
Figure 19:
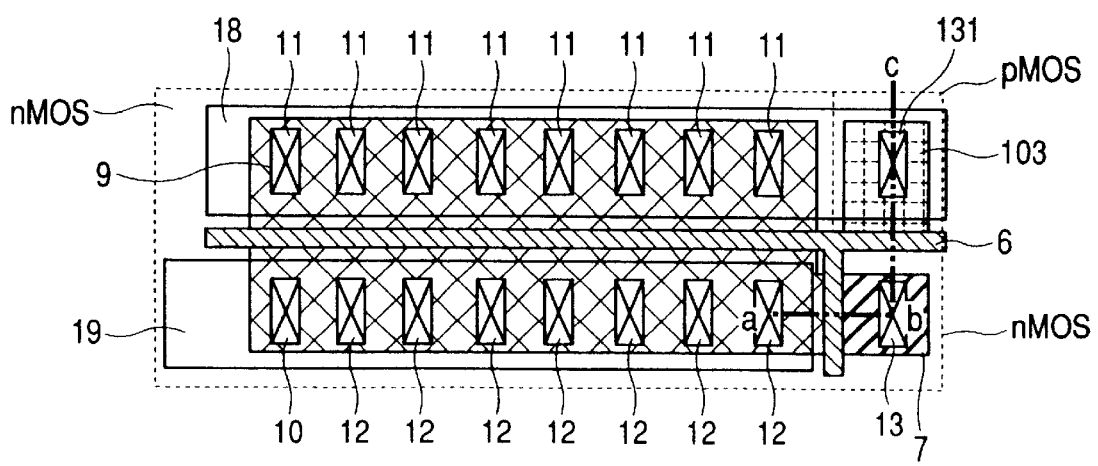
FIG. 19 is a plan view of the semiconductor integrated circuit according to the fifth embodiment of the present invention.
Figure 20:
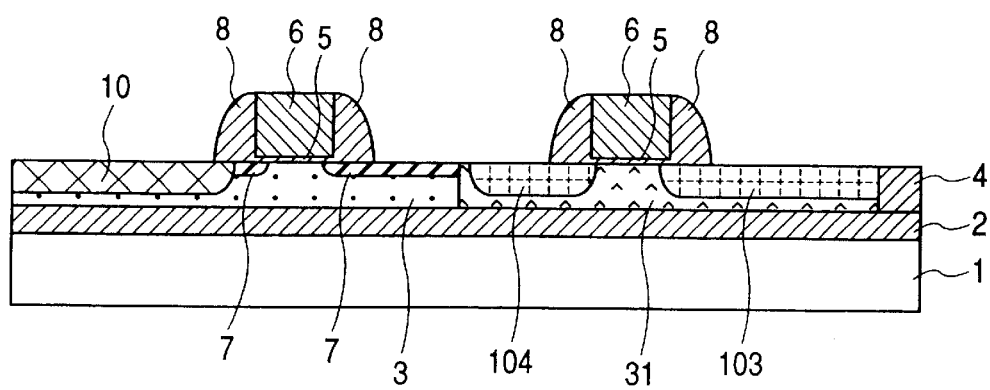
FIG. 20 is a sectional view of the semiconductor integrated circuit according to the fifth embodiment of the present invention for explaining its fabrication process in the order of process steps.
Figure 21:
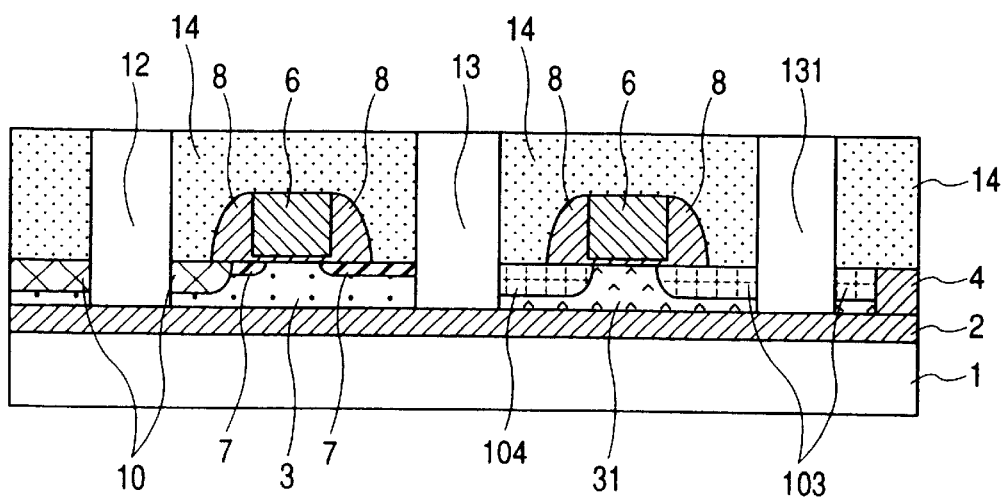
FIG. 21 is a sectional view of the semiconductor integrated circuit according to the fifth embodiment of the present invention for explaining its fabrication process in the order of process steps.
Figure 22:
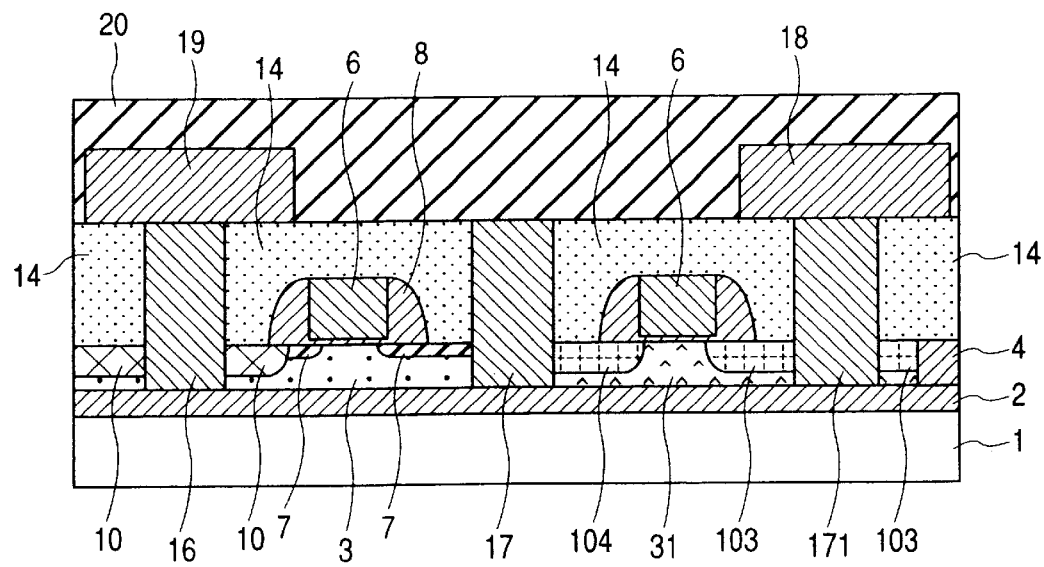
FIG. 22 is a sectional view of the semiconductor integrated circuit according to the fifth embodiment of the present invention.

FIG. 18(*a*) is a circuit configuration diagram of a semiconductor integrated circuit according to a fifth embodiment of the present invention. FIG. 19 is a plan view of a completed semiconductor integrated circuit according to the fifth embodiment. FIGS. 20 and 21 are sectional views of the semiconductor integrated circuit for explaining its fabrication process. It should be noted that each of the sectional views is taken along a line abc in the plan view of FIG. 19. FIG. 22 is a sectional view of the completed semiconductor integrated circuit. It should be noted that reference numerals in the plan view of FIG. 19 denote parts as in the corresponding sectional views.

The fifth embodiment is an example of a semiconductor integrated circuit in which a pMOS transistor MP3 is provided instead of the resistor RS of the first embodiment. An nMOS transistor MN2 is disposed in the same manner as in the first embodiment, and has the same function as in the first embodiment. As in the case of the resistor RS of the first embodiment, the transistor MP3 has a function of quickly extracting, to an earth potential line, a charge that is accumulated in the body of the transistor MN1 when it is in a non-conducting state. With regard to the extraction of charge, as compared with the structure of the previous embodiment, the structure of the fifth embodiment makes it possible to allow body potential to stably change at high speed so as to follow change in a gate input signal and thereby make threshold values variable. This is because according to the fifth embodiment, it is possible to form a lower body charge control resistance.

Other than a process of forming a pMOS transistor MP3, the semiconductor integrated circuit of the fifth embodiment is fabricated according to the fabrication method of the second embodiment.

In the fifth embodiment, an n-type SOI region 31 is selectively formed in part of an SOI layer region, which is the same as an SOI layer 3 where an nMOS active region is formed. In this case, conditions for ion implantation may be the same as those of the second embodiment. Then, according to the fabrication method of the second embodiment, a shallow highly concentrated n-type diffusion layer 7, a deep highly concentrated n-type diffusion layer 10 in the p-type SOI layer 3 region, and deep highly concentrated p-type diffusion layers 103 and 104 in the n-type SOI layer 31 region are fabricated. The shallow highly concentrated n-type diffusion layer 7 is formed in a self-aligning relation to a gate insulator 5, a gate electrode 6, and a gate electrode 6 in the p-type SOI layer 3 region. The deep highly concentrated n-type diffusion layer 10 in the p-type SOI layer 3 region is formed in a self-aligning relation to the gate side wall insulator 8.

In a region where connection with a body node BN of the transistor MN1 is to be made in a final step, the above-mentioned deep highly concentrated n-type diffusion layer 10 is not formed, and only the shallow highly concentrated n-type diffusion layer 7 is disposed (FIG. 20).

The fabrication process is continued from a state shown in FIG. 20 according to the fabrication process of the second embodiment to deposit a gate protection insulator 14 and create holes 12, 13, and 131 in desired locations. Following the creation of these holes, the SOI layers 3 and 31 are selectively etched. The holes 12, 13, and 131 are disposed in a drain diffusion layer region, a body node BN connection region, and a source region, respectively. The etching of the SOI layers in the holes 12 and 131 may be omitted if desired (FIG. 21).

In a state shown in FIG. 21, an interconnection protection insulator 20 and drain electrode 19, source electrode 18, and other electrode interconnections are formed as in the second embodiment. Thus, the semiconductor integrated circuit according to the fifth embodiment is fabricated (FIG. 22).

In the semiconductor integrated circuit according to the fifth embodiment, as in the transistor of the first embodiment, various phenomena observed in direct current and pulse measurements such as instability and decrease in withstand voltage caused by floating body effect are eliminated. In addition, the gradient of dependence of source-drain current on gate voltage is 62 mV per order of magnitude of change in the current, which is a substantially theoretical and extremely small value. Thus, in the fifth embodiment, it is possible to achieve low voltage and low leakage current properties.

Sixth Embodiment

Figure 23:
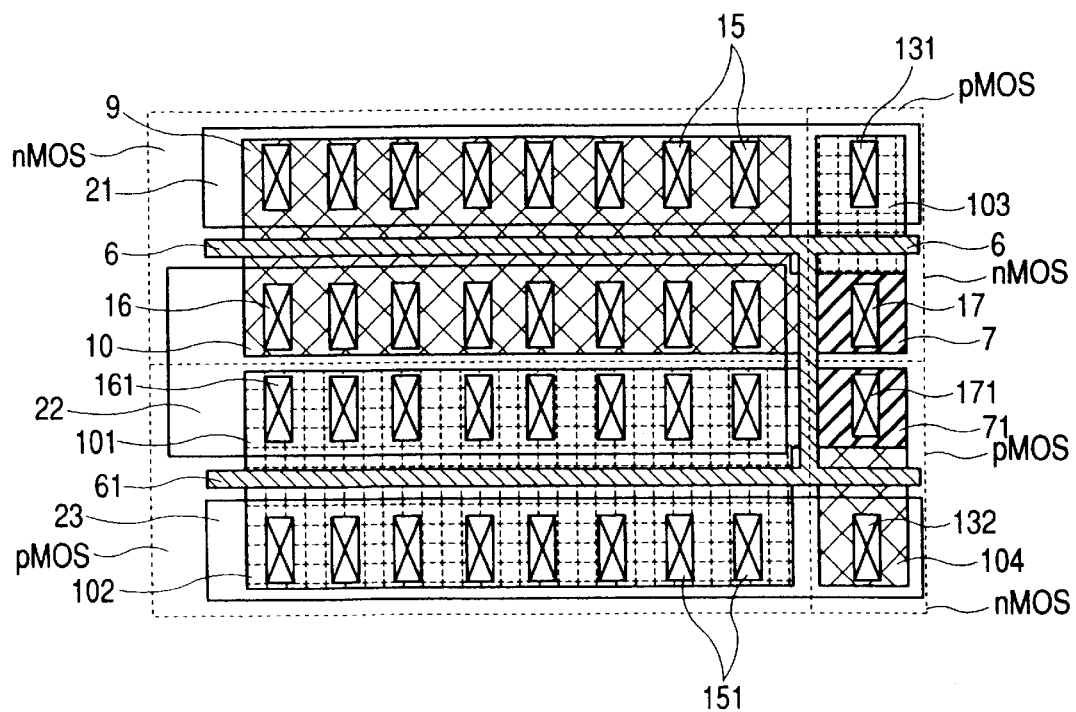
FIG. 23 is a plan view of the semiconductor integrated circuit according to the sixth embodiment of the present invention.

FIG. 18(b) is a circuit configuration diagram of a semiconductor integrated circuit according to a sixth embodiment of the present invention. FIG. 23 is a plan view of a completed semiconductor integrated circuit according to the sixth embodiment. It should be noted that in FIG. 23, the same reference numerals as in the previous embodiments denote the same parts as in the previous embodiments.

In the sixth embodiment, the structure of the fifth embodiment for nMOS is also applied to pMOS of the opposite conduction type to provide a CMOS inverter structure.

In the sixth embodiment, in a process in which voltage at an input node of an inverter formed by transistors MN1 and MP1 falls from 1 V to 0 V and then MP1 goes into a conducting state and MN1 goes into a non-conducting state, MP2 and MP3 also go into a conducting state while MN2 and MN3 go into a non-conducting state. Thus, the potential of a body node BP of MP1 is lowered from 1 V to 0.4 V by output potential. At this point in time, the potential of a body node BN of MN1 is also lowered to a negative potential. This means that the threshold voltages of MP1 and MN1 change in such a manner that a current flowing through MP1 is made larger, and leakage current is further reduced by the non-conducting state of MN1. As a result, in accordance with output properties of the inverter according to the sixth embodiment, it is possible to obtain rapid rising properties as compared with conventional inverters fabricated on normal Si and SOI substrates.

In a process in which voltage at the input node of the inverter to be measured rises from 0 V to 1 V and then MN1 goes into a conducting state and MP1 goes into a non-conducting state, MN2 and MN3 also go into a conducting state while MP2 and MP3 go into a non-conducting state. Thus, the potential of the body node BN of MN1 is raised from 0 V to 0.6 V by the output potential. At this point, the potential of the body node BP of MP1 is also raised to a potential of more than 1 V. Thus, the threshold voltages of MP1 and MN1 change in such a manner that a current flowing through MN1 is made larger, and leakage current is further reduced by the non-conducting state of MP1. As a result, in accordance with the output properties of the inverter according to the sixth embodiment, it is possible to obtain rapid rising properties as compared with conventional inverters fabricated on normal Si and SOI substrates. Even under a condition where a great load capacitance of 1 pF is to be driven, according to the inverter of the sixth embodiment, it is possible to achieve high speed and high driving power properties with only an increase of about 10% or less in occupied area per channel width, which results from addition of MN2, MN3, MP2 and MP3.

The transistors MN3 and MP3 of the sixth embodiment have a function of extracting accumulated charges of the body nodes BP and BN at a stage where MP1 and MN1 go into a non-conducting state, respectively. This results in an effect of increasing absolute values of the threshold voltages in a non-conducting state and thereby reducing leakage current. Direct current properties of the inverter according to the sixth embodiment and its low voltage and high speed operation properties in pulse operation are basically not different from those of the inverter of the second embodiment, but its high speed operation properties are improved by a difference in effect obtained when transistors are used for extraction of accumulated body charges instead of resistors.

The method for fabrication of the semiconductor integrated circuit of the sixth embodiment is the same as that of the second embodiment. However, as shown in FIG. 23, layout of the sixth embodiment needs to be modified for addition of MN3 and MP3. Such modification for the nMOS region may be made in the same manner as in the fifth embodiment, while layout of the pMOS region may be provided by reversing the conduction type of the nMOS region.

Seventh Embodiment

Figure 25:
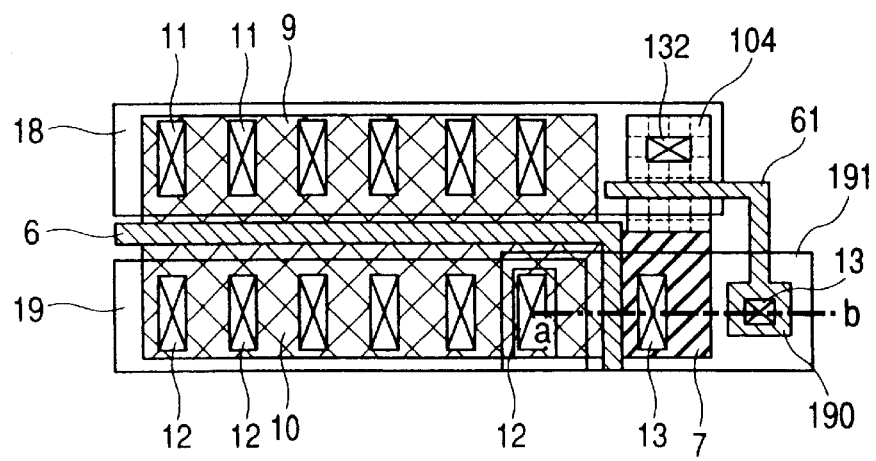
FIG. 25 is a plan view of the semiconductor integrated circuit according to the seventh embodiment of the present invention.
Figure 26:
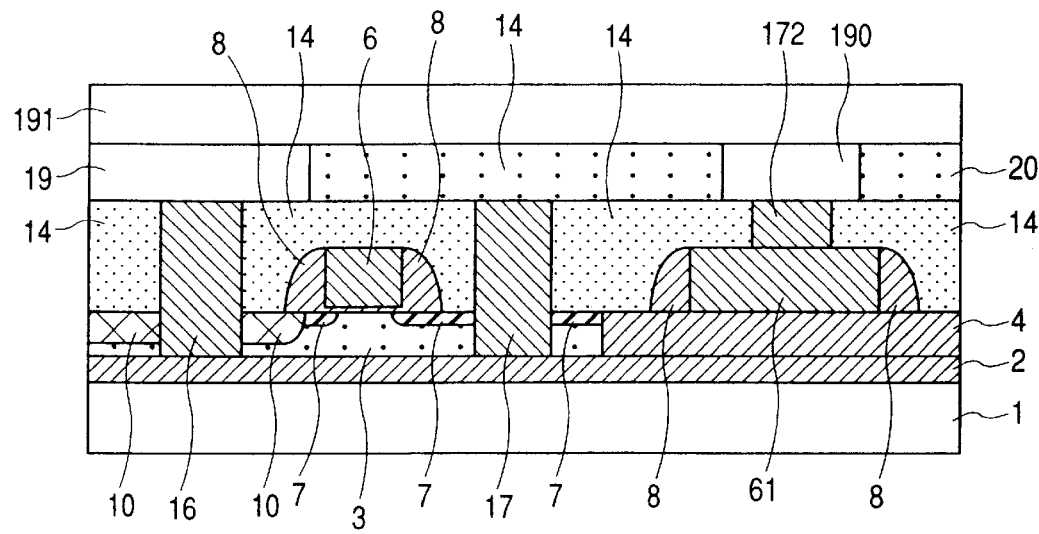
FIG. 26 is a sectional view of the semiconductor integrated circuit according to the seventh embodiment of the present invention.

FIG. 24(a) is a circuit configuration diagram of a semiconductor integrated circuit according to a seventh embodiment of the present invention. FIG. 25 is a plan view of a completed semiconductor integrated circuit according to the seventh embodiment. FIG. 26 is a sectional view of the completed semiconductor integrated circuit, taken along a line ab shown in the plan view. It should be noted that in FIGS. 24(a) and 25, the same reference numerals as in the previous embodiments denote the same parts as in the previous embodiments.

In the seventh embodiment, an nMOS transistor MN3 is provided instead of the pMOS transistor MP3 of the fifth embodiment. A gate electrode of the transistor MN3 is connected to a drain node of the transistor MN1 instead of its gate electrode. More specifically, in the seventh embodiment, nMOS rather than pMOS is formed in part of the same SOI layer 3 active region where the fundamental transistor MN1 is formed.

A method of fabricating the semiconductor integrated circuit of the seventh embodiment is the same as that of the first embodiment. In the seventh embodiment, the transistor MN3 is provided instead of the resistor RS, and in order to connect the gate electrode 61 of MN3 to a drain diffusion layer 10 of MN1, creation of a hole 172 on the gate electrode 61, filling of the hole with a laminated layer, connection with a source electrode by means of interconnection metallic films 190 and 191 and the like are performed according to a desired circuit configuration.

The semiconductor integrated circuit of the seventh embodiment fabricated according to the fabrication method and the circuit configuration mentioned above is effective in improving the performance of the transistor MN1. Also in the seventh embodiment, the same improvements in effects as those of the transistor of the fifth embodiment are obtained. A difference in effect from the fifth embodiment is that nMOS and pMOS do not need to be disposed in the same SOI active region so as to coexist with each other, and therefore exact pattern alignment is not required.

Eighth Embodiment

Figure 24:
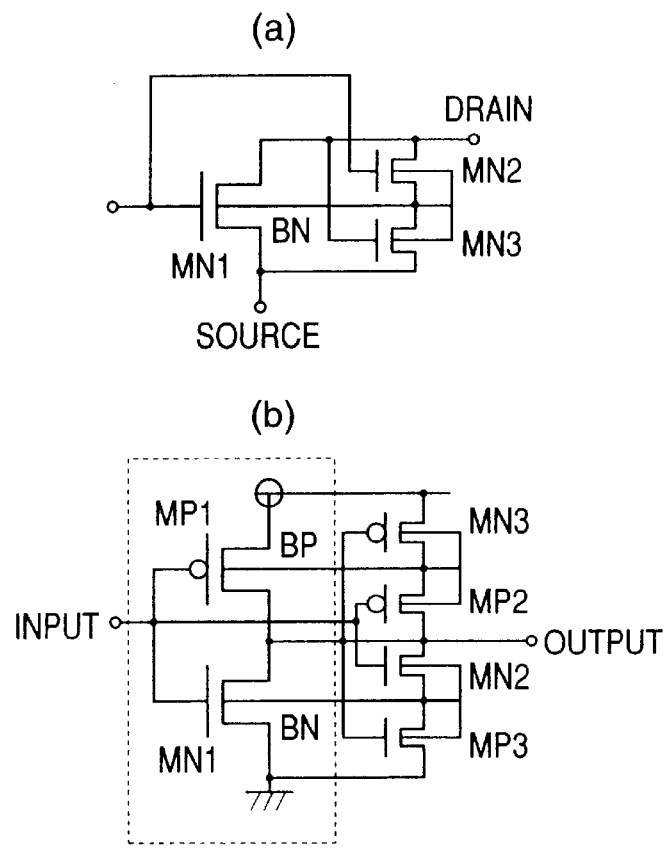
FIGS. 24(a) and 24(b) are circuit configuration diagrams of semiconductor integrated circuits according to a seventh embodiment and an eighth embodiment of the present invention.
Figure 27:
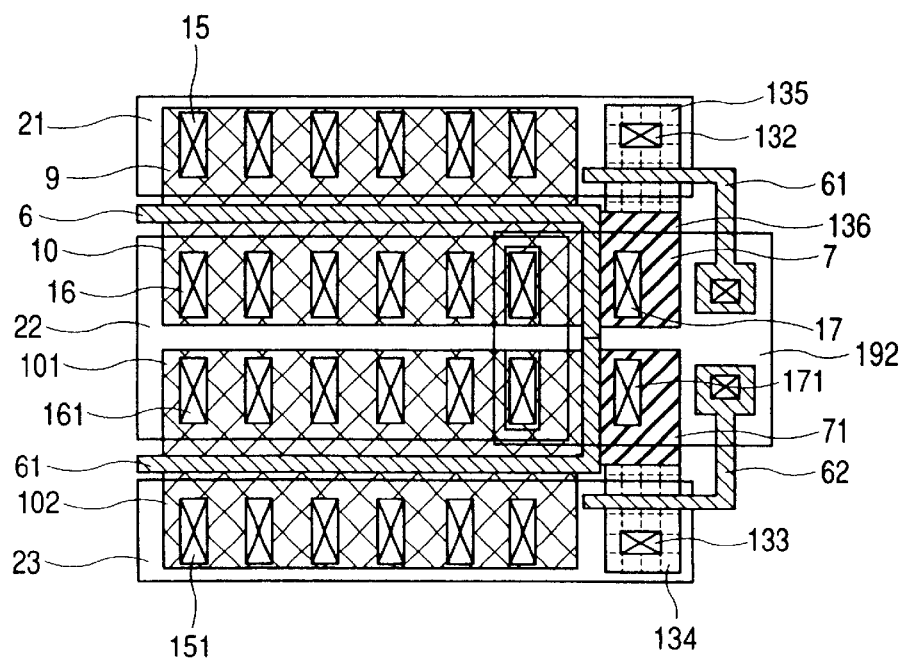
FIG. 27 is a plan view of the semiconductor integrated circuit according to the eighth embodiment of the present invention.

FIG. 24(*b*) is a circuit configuration diagram of a semiconductor integrated circuit according to an eighth embodiment of the present invention. FIG. 27 is a plan view of a completed semiconductor integrated circuit according to the eighth embodiment. It should be noted that in FIGS. 24(*b*) and 27, the same reference numerals as in the previous embodiments denote the same parts as in the previous embodiments.

In the eighth embodiment, the structure of the seventh embodiment for nMOS is also applied to pMOS of the opposite conduction type to provide a CMOS inverter structure.

In the eighth embodiment, in a process in which voltage at an input node of an inverter formed by transistors MN1 and MP1 falls from 1 V to 0 V and then MP1 goes into a conducting state and MN1 goes into a non-conducting state, output potential is in a process of transition from 1 V to 0 V, and therefore MP2 goes into a conducting state while MP3 goes into a non-conducting state. MN2 goes into a non-conducting state and MN3 goes into a conducting state. Thus, the potential of a body node BP of MP1 is lowered from 1 V to 0.4 V by the output potential. At this point, the potential of a body node BN of MN1 is also lowered to a negative potential. This means that the threshold voltages of MP1 and MN1 change in such a manner that a current flowing through MP1 is made larger, and leakage current is further reduced by the non-conducting state of MN1. As a result, in accordance with output properties of the inverter according to the eighth embodiment, it is possible to obtain rapid rising properties in low voltage operation as compared with conventional inverters fabricated on normal Si and SOI substrates.

In a process in which voltage at the input node of the fundamental inverter rises from 0 V to 1 V and then MN1 goes into a conducting state and MP1 goes into a non-conducting state, the output potential is in a process of transition from 0 V to 1 V, and therefore MN2 goes into a conducting state while MN3 goes into a non-conducting state. MP2 goes into a non-conducting state and MP3 goes into a conducting state. Thus, the potential of the body node BN of MN1 is raised from 0 V to 0.6 V by the output potential. At this point, the potential of the body node BP of MP1 is also raised to a potential of more than 1 V. Thus, the threshold voltages of MP1 and MN1 change in such a manner that a current flowing through MN1 is made larger, and leakage current is further reduced by the non-conducting state of MP1. As a result, in accordance with the output properties of the inverter according to the eighth embodiment, it is possible to obtain rapid rising properties in low voltage operation as compared with conventional inverters fabricated on normal Si and SOI substrates. The low voltage and high speed properties of the inverter are the same as those of the inverter according to the sixth embodiment. A difference from the inverter of the sixth embodiment is that nMOS and pMOS do not need to be disposed in the same SOI active region so as to coexist with each other, and therefore exact pattern alignment is not required.

Ninth Embodiment

Figure 28:
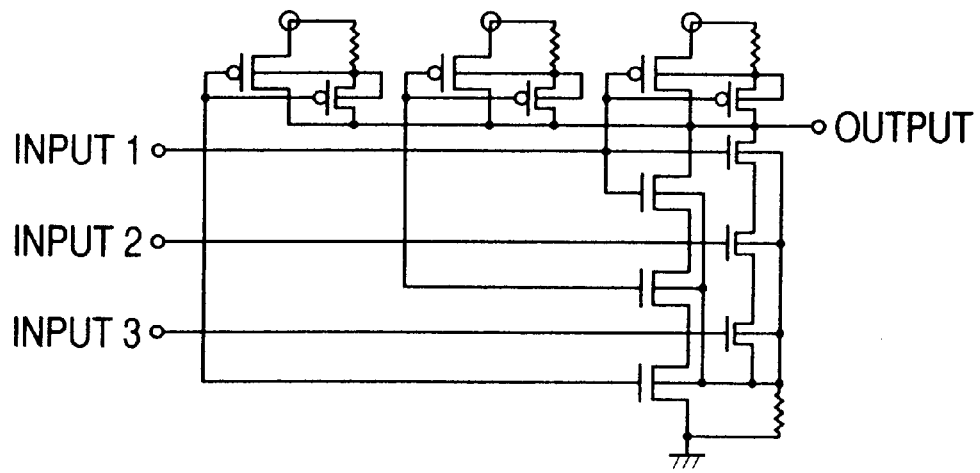
FIG. 28 is a circuit configuration diagram of a semiconductor integrated circuit according to a ninth embodiment of the present invention.

FIG. 28 is a circuit configuration diagram of assistance in explaining a semiconductor integrated circuit according to a ninth embodiment of the present invention. The ninth embodiment is an example in which the semiconductor integrated circuit according to the second embodiment is applied to a NAND circuit or a NOR circuit.

In the ninth embodiment, a three-input NAND circuit will be described as an example. In addition to the NAND circuit obtained by connecting nMOSs in series, the ninth embodiment can be applied in exactly the same manner to a NAND circuit obtained by connecting pMOSs in series. In the ninth embodiment, one input is applied to gate electrodes, and a group of fundamental transistors connected in series with each other are disposed in the same SOI layer active region. Respective pMOS fundamental transistors having gate electrodes in common with the above fundamental transistors are disposed in SOI layer active regions that are independent of each other. In this case, each of the SOI layer active regions is formed in such a manner that a body node of its transistor is connected to an earth potential line via one resistor. The semiconductor integrated circuit of the ninth embodiment is fabricated according to the structure and the fabrication method of the second embodiment. Further, in accordance with the structure of the second embodiment, one subsidiary transistor is disposed in parallel with each of the fundamental transistors in the SOI layer active regions so as to connect an output node and the body node of the fundamental transistor. A gate electrode of the subsidiary transistor is connected to a gate electrode of the fundamental transistor in parallel therewith. In the region where fundamental transistors are connected in series with each other, the subsidiary transistors are connected in series with each other, and are connected to a body node and the output node at either end of the subsidiary transistors in series. From viewpoints of controlling increase in parasitic capacitance and ensuring high speed operation, it is desirable that the structure of the subsidiary transistor be $\frac{1}{10}$ or less as compared with channel length of the fundamental transistor.

The semiconductor integrated circuit according to the ninth embodiment operates as a NAND circuit, and as in the inverter circuit according to the second embodiment, the action of the subsidiary transistors makes the threshold voltage values of the fundamental transistors variable so as to follow change in input potential in such a manner that the threshold voltage of an "on" transistor is lowered and that of an "off" transistor is raised. Thus, it is possible to provide great current even in a condition of low supplied voltage and therefore achieve very high speed operation of a NAND circuit that produces little leakage current and whose performance is at the same high level as that of the inverter described in the second embodiment. As for direct current properties, it is possible to achieve both great current properties and low leakage current properties.

Tenth Embodiment

Figure 29:
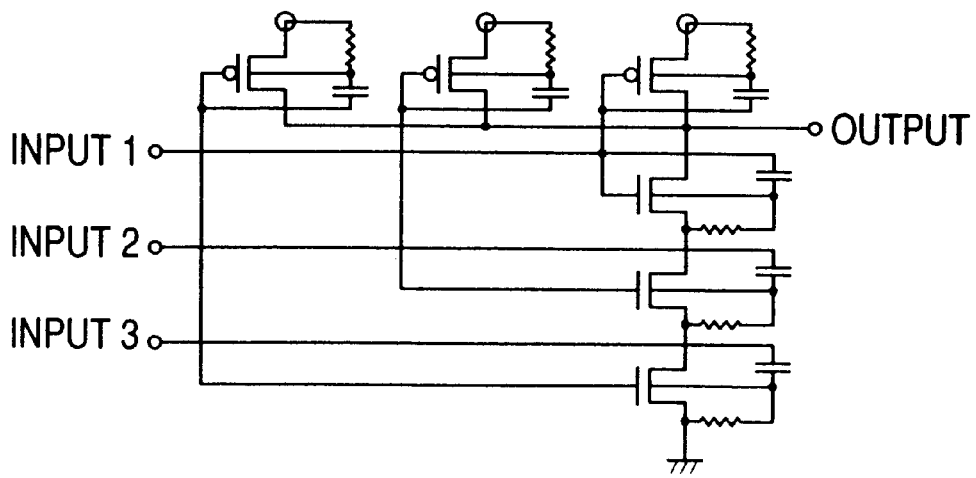
FIG. 29 is a circuit configuration diagram of a semiconductor integrated circuit according to a tenth embodiment of the present invention.

FIG. 29 is a circuit configuration diagram of assistance in explaining a semiconductor integrated circuit according to a tenth embodiment of the present invention. The tenth embodiment is an example in which the semiconductor integrated circuit according to the fourth embodiment is applied to a NAND circuit or a NOR circuit.

As in the ninth embodiment, a three-input NAND circuit will be described as an example in the tenth embodiment. In addition to the NAND circuit obtained by connecting nMOSs in series, the tenth embodiment can be applied in exactly the same manner to a NAND circuit obtained by connecting pMOSs in series. In the tenth embodiment, both nMOS and pMOS fundamental transistors are disposed in SOI layer active regions that are separate from each other. In each of the SOI layer active regions, a body node of its transistor is connected to a source node via a resistor and is also connected to a gate input node via a capacitor, thus comprising one unit. In this case, the capacitor mentioned above is different from the gate capacitance component of the fundamental transistor as described in the third and fourth embodiments, and therefore does not affect direct current properties of the fundamental transistor.

The semiconductor integrated circuit according to the tenth embodiment operates as a NAND circuit, and as in the inverter circuit according to the fourth embodiment, the action of the capacitors makes the threshold voltage values of the fundamental transistors variable only in a transient state in such a manner that the threshold voltage of an "on" transistor is lowered or that of an "off" transistor is raised as a result of a rise or fall of body potential following such change in gate potential. Thus, it is possible to provide great current even in a condition of low supplied voltage and therefore achieve very high speed operation of a NAND circuit that produces little leakage current and whose performance is at the same high level as that of the inverter described in the second embodiment. Optimum conditions for a capacitance-resistance product that governs a transient change time constant of body potential may be achieved by adopting conditions described in the third and fourth embodiments.

Eleventh Embodiment

Figure 30:
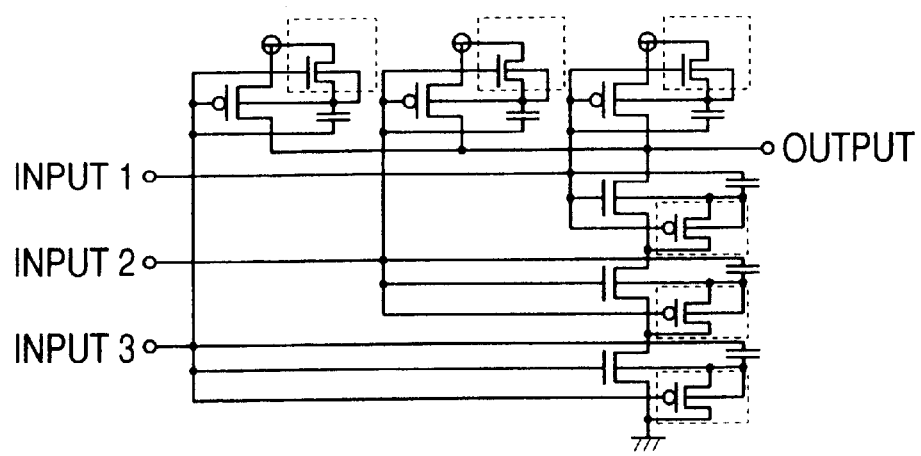
FIG. 30 is a circuit configuration diagram of a semiconductor integrated circuit according to an eleventh embodiment of the present invention.

FIG. 30 is a circuit configuration diagram of assistance in explaining a semiconductor integrated circuit according to an eleventh embodiment of the present invention. In the eleventh embodiment, the resistors of the semiconductor integrated circuit according to the tenth embodiment are replaced with subsidiary transistors of the opposite conduction types from fundamental transistors, and the resulting configuration is applied to a NAND circuit or a NOR circuit. Gate electrodes of the subsidiary transistors are connected to gate electrodes of the fundamental transistors connected in parallel therewith. The inserted subsidiary transistor does not conduct when the fundamental transistor is in a conducting state, and conducts when the fundamental transistor is in a non-conducting state. Specifically, as in the case of the resistors according to the tenth embodiment, the subsidiary transistors of the eleventh embodiment quickly extract accumulated body charge when the fundamental transistors are switched into a non-conducting state and thereby quickly eliminate history of switching properties, thus enabling higher speed operation. In the eleventh embodiment, a fundamental transistor, a capacitor, and a subsidiary transistor comprise one unit, and a NAND circuit to which the unit is applied has been described as an example. However, the eleventh embodiment may be applied to a configuration in which such units are not connected in series with each other, and an inverter is formed by one pMOS unit and one nMOS unit. This makes it possible to achieve low voltage and super high speed inverter operation.

Twelfth Embodiment

Figure 31:
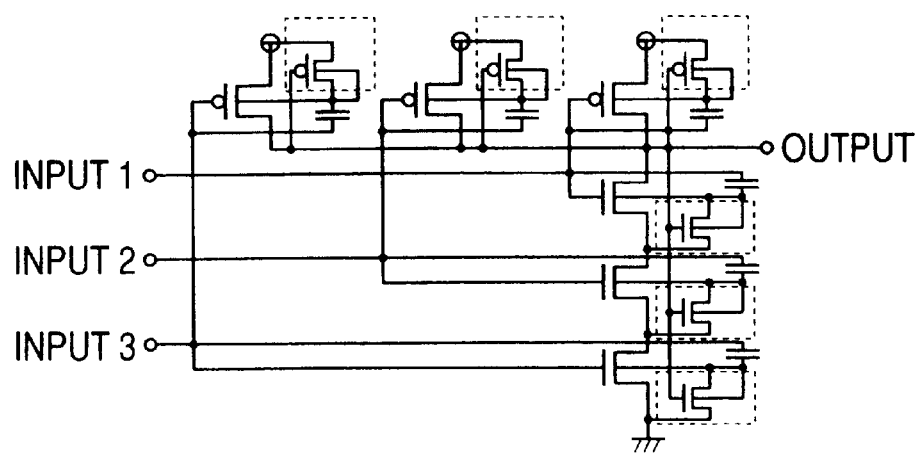
FIG. 31 is a circuit configuration diagram of a semiconductor integrated circuit according to a twelfth embodiment of the present invention.

FIG. 31 is a circuit configuration diagram of assistance in explaining a semiconductor integrated circuit according to a twelfth embodiment of the present invention. In the twelfth embodiment, the subsidiary transistors of the semiconductor integrated circuit according to the eleventh embodiment are replaced with subsidiary transistors of the opposite conduction types, and the resulting configuration is applied to a NAND circuit or a NOR circuit. Gate electrodes of the subsidiary transistors are connected to an output node instead of input nodes. As for improvement in speed of switching properties of the NAND circuit of the twelfth embodiment, it is possible to achieve high speed switching properties similar to those of the tenth embodiment, as a result of effects of capacitors allowing body potential to change so as to follow change in a gate input signal. The subsidiary transistors of the twelfth embodiment function in the same manner as the subsidiary transistors of the eleventh embodiment. Specifically, the subsidiary transistors of the twelfth embodiment quickly extract accumulated body charge after switching and thereby quickly eliminate history of switching properties, thus enabling higher speed operation. In addition, the twelfth embodiment has an improvement over the eleventh embodiment in that nMOS and pMOS do not need to be disposed in the same SOI active region so as to coexist with each other, and therefore exact pattern alignment is not required.

Thirteenth Embodiment

Figure 32:
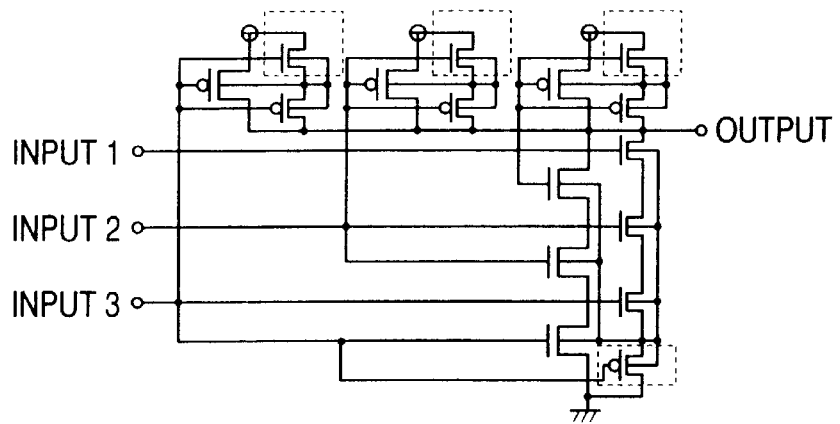
FIG. 32 is a circuit configuration diagram of a semiconductor integrated circuit according to a thirteenth embodiment of the present invention.

FIG. 32 is a circuit configuration diagram of assistance in explaining a semiconductor integrated circuit according to a thirteenth embodiment of the present invention. The thirteenth embodiment is an example in which the semiconductor integrated circuit according to the fifth and sixth embodiments is applied to a NAND circuit or a NOR circuit. The thirteenth embodiment is a semiconductor integrated circuit according to the ninth embodiment in which resistors are replaced with subsidiary transistors of the opposite conduction types from fundamental transistors. Gate electrodes of the subsidiary transistors are connected to input gate nodes of the fundamental transistors. The subsidiary transistors of the thirteenth embodiment function in the same manner as the subsidiary transistors in the semiconductor integrated circuit according to the twelfth embodiment. Specifically, the subsidiary transistors of the thirteenth embodiment quickly extract accumulated body charge after switching and thereby quickly eliminate history of switching properties, thus enabling higher speed operation. The semiconductor integrated circuit according to the thirteenth embodiment operates as a NAND circuit, and as in the inverter circuit according to the sixth embodiment, the action of the subsidiary transistors makes the threshold voltage values of the fundamental transistors variable so as to follow change in input potential in such a manner that the threshold voltage of an "on" transistor is lowered and that of an "off" transistor is raised. Thus, it is possible to provide great current even in a condition of low supplied voltage and therefore achieve very high speed operation of a NAND circuit that produces little leakage current and whose performance is at the same high level as that of the inverter described in the sixth embodiment. As for direct current properties, it is possible to achieve both great current properties and low leakage current properties.

Fourteenth Embodiment

Figure 33:
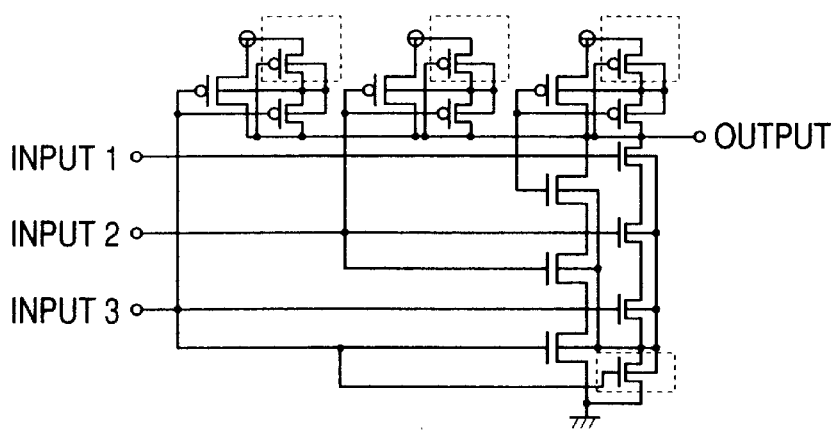
FIG. 33 is a circuit configuration diagram of a semiconductor integrated circuit according to a fourteenth embodiment of the present invention.

FIG. 33 is a circuit configuration diagram of assistance in explaining a semiconductor integrated circuit according to a fourteenth embodiment of the present invention. The fourteenth embodiment is an example in which the semiconductor integrated circuit according to the seventh and eighth embodiments is applied to a NAND circuit or a NOR circuit.

The added subsidiary transistors of the semiconductor integrated circuit according to the thirteenth embodiment are transistors of the opposite conduction types from the fundamental transistors. On the other hand, in the fourteenth embodiment, added subsidiary transistors are of the same conduction types as fundamental transistors, and gate electrodes of the added transistors are connected to an output node rather than gate input nodes.

The semiconductor integrated circuit according to the fourteenth embodiment operates as a NAND circuit, and as in the NAND circuit according to the thirteenth embodiment, the action of the subsidiary transistors makes the threshold voltage values of the fundamental transistors variable so as to follow change in input potential in such a manner that the threshold voltage of an "on" transistor is lowered and that of an "off" transistor is raised. Thus, it is possible to provide great current even in a condition of low supplied voltage and therefore achieve very high speed operation of a NAND circuit that produces little leakage current and whose performance is at the same high level as that of the inverter described in the eighth embodiment. As for direct current properties, it is possible to achieve both great current properties and low leakage current properties. In addition, the fourteenth embodiment has an improvement over the thirteenth embodiment in that nMOS and pMOS do not need to be disposed in the same SOI active region so as to coexist with each other, and therefore exact pattern alignment is not required.

Fifteenth Embodiment

Figure 34:
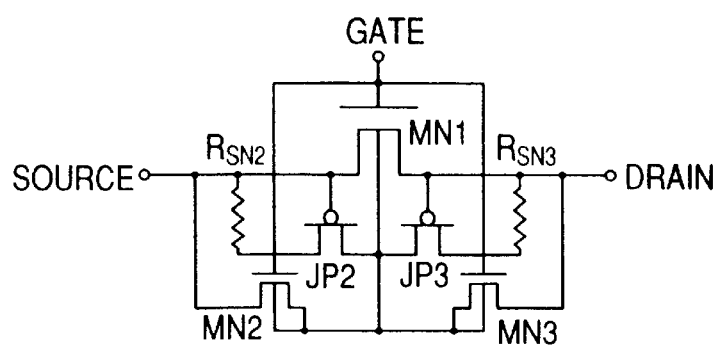
FIG. 34 is a circuit configuration diagram of a semiconductor integrated circuit according to a fifteenth embodiment of the present invention.
Figure 35:
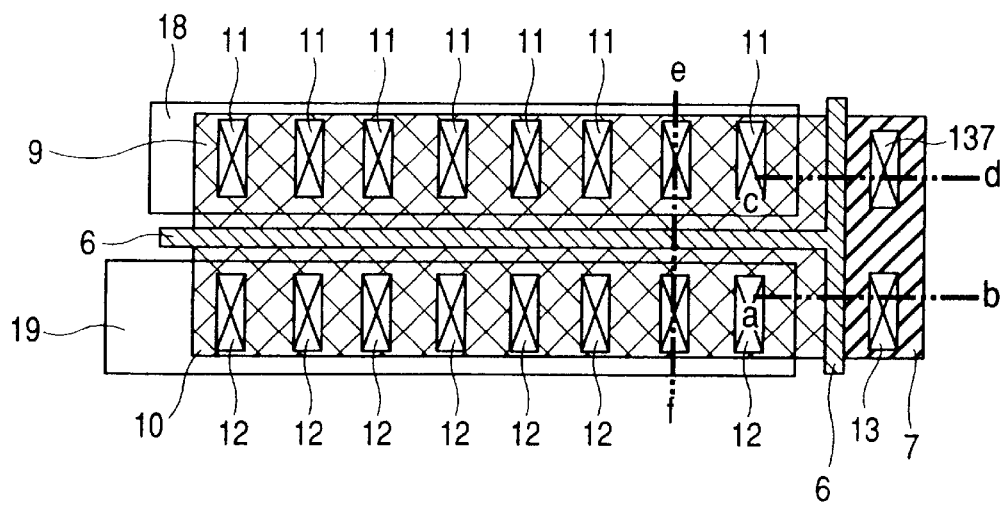
FIG. 35 is a plan view of the semiconductor integrated circuit according to the fifteenth embodiment of the present invention.

FIG. 34 is a circuit configuration diagram of assistance in explaining a semiconductor integrated circuit according to a fifteenth embodiment of the present invention. FIG. 35 is a plan view of a completed semiconductor integrated circuit according to the fifteenth embodiment. The semiconductor integrated circuit according to the fifteenth embodiment has a switching function. In the fifteenth embodiment, a fundamental concept of the present invention is applied to a transfer circuit, in which relation between a source and a drain is arbitrarily changed, in order to decrease voltage and increase operation speed of the circuit. While the semiconductor integrated circuit of the first embodiment has an asymmetric source/drain structure, structure of the semiconductor integrated circuit of the fifteenth embodiment is changed into a symmetric source/drain structure so that the semiconductor integrated circuit of the fifteenth embodiment can be applied to a transfer circuit.

In FIG. 34, a subsidiary transistor MN3 and a resistor RSN2 added to a fundamental transistor MN1 are the same as M2 and RS in FIG. 1, respectively. In the fifteenth embodiment, for application of a fundamental concept of the present invention to a transfer circuit, a subsidiary transistor MN2 and a resistor RSN1 are added to a source side and a drain side, respectively, to form a symmetric source/drain structure.

As in the first embodiment, in which the subsidiary transistor MN3 is formed at a portion of the key-shaped gate electrode disposed between points b and c of FIG. 4, in the fifteenth embodiment, the subsidiary transistors MN2 and MN3 are formed at a portion of a T-shaped gate electrode disposed between lines cd and ac in FIG. 35. The channel width of the subsidiary transistors MN2 and MN3 may adequately be 1/10 or less of the channel width of the fundamental transistor so that an increase in occupied area resulting from addition of the subsidiary transistors MN2 and MN3 will be ten percent or less. Connection of the subsidiary transistors MN2 and MN3 with a body node of MN1 is performed in accordance with the first embodiment by creating holes 13 and 137 in an SOI layer 3 that reach a buried insulator, filling the holes with laminated metallic layers, and thereby making a short circuit between a shallow n-type highly concentrated diffusion layer 7 and the SOI layer 3. The resistors RSN2 and RSN3 have the SOI layer between the bottom of the source diffusion layer of the first embodiment and the buried insulator as their current path, and are made of a resistance component formed in a region that extends to a source connection hole.

The roles of the source and the drain in a transfer circuit can be changed by a node signal. Therefore, the switching needs to be made automatically in such a way that a highly concentrated diffusion layer on a low potential signal side is recognized as source, and only a resistor on the source side functions, while a resistor on the drain side is ignored. As a technique for meeting such specifications, in the semiconductor integrated circuit of the fifteenth embodiment, a resistor path at the bottom of a drain diffusion layer to which a high potential is applied is automatically blocked by expansion of a drain depletion layer. Junction field effect transistors of the opposite conduction type from the fundamental transistor MN1 shown in FIG. 35 equivalently describe the above-mentioned effect of automatically blocking the resistor path on the drain side. Electrical properties of the resistor on the source side and a series resistance of the junction field effect transistor are determined only by the electrical properties of the resistor.

In the transfer circuit according to the fifteenth embodiment shown in FIG. 34, when an input is applied to the gate electrode of the fundamental transistor MN1 to bring the fundamental transistor MN1 into a conducting state, the subsidiary transistors MN2 and MN3 also go into a conducting state. Body node potential of MN1 rises to ½ of source-drain voltage, and thus functions such that threshold voltage is lowered and great current flows even at a low gate voltage. When the fundamental transistor MN1 is in a non-conducting state, the subsidiary transistors MN2 and MN3 also go into a non-conducting state. In this state, it is necessary to quickly extract charge accumulated at the body node of MN1 and thereby eliminate history of the input signal. Extraction of the body charge is performed via the resistor RSN2 or RSN3 connected to a low potential source/drain node, and thereby floating body phenomena can be eliminated. Thus, according to the fifteenth embodiment, it is possible to make the threshold voltage of the fundamental transistor variable so as to follow change in an input signal by the action of the subsidiary transistors MN2 and MN3. Therefore, it is possible to realize a transfer circuit that has low voltage, ultrashort delay properties and also to completely eliminate occurrence of floating body effect specific to an SOI transistor.

Sixteenth Embodiment

Figure 36:
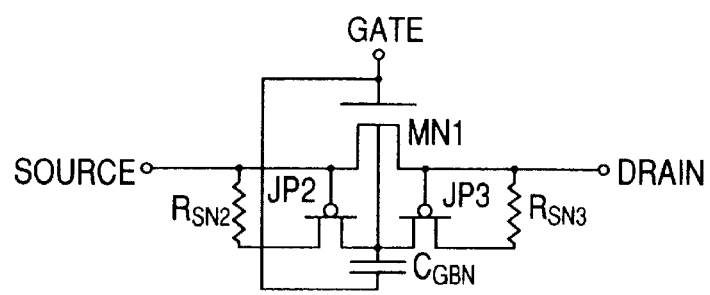
FIG. 36 is a circuit configuration diagram of a semiconductor integrated circuit according to a sixteenth embodiment of the present invention.

FIG. 36 is a circuit configuration diagram of assistance in explaining a semiconductor integrated circuit according to a sixteenth embodiment of the present invention. As with the fifteenth embodiment, the sixteenth embodiment is an example in which the present invention is applied to a transfer circuit. In the sixteenth embodiment, in order to make threshold voltage of a fundamental transistor variable in a symmetric source/drain structure, the capacitor between the body and the gate described in the third embodiment is added to a structure that allows body potential to change so as to follow change in gate input. A capacitor CGBN is fabricated according to the fabrication method of the third embodiment. Resistors RSN2 and RSN3 and junction field effect transistors describing an equivalent circuit in FIG. 36 are the same as those of the fifteenth embodiment. Specifically, also in the sixteenth embodiment, one of a source node and a drain node with lower potential automatically functions as source, only a resistor path connected to the source node becomes effective in extracting accumulated body charge, and the other resistor path is automatically blocked by expansion of a drain depletion layer.

In the transfer circuit according to the sixteenth embodiment, the threshold voltage of the fundamental transistor is made variable because of the presence of the capacitor CGBN. Thus, it is possible to realize a transfer circuit that has low voltage, ultrashort delay properties and also to completely eliminate occurrence of floating body effect specific to an SOI transistor.

Seventeenth Embodiment

Figure 37:
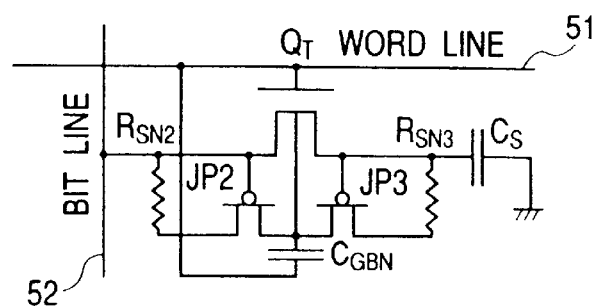
FIG. 37 is a circuit configuration diagram of a dynamic random access memory unit cell according to a seventeenth embodiment of the present invention.
Figure 38:
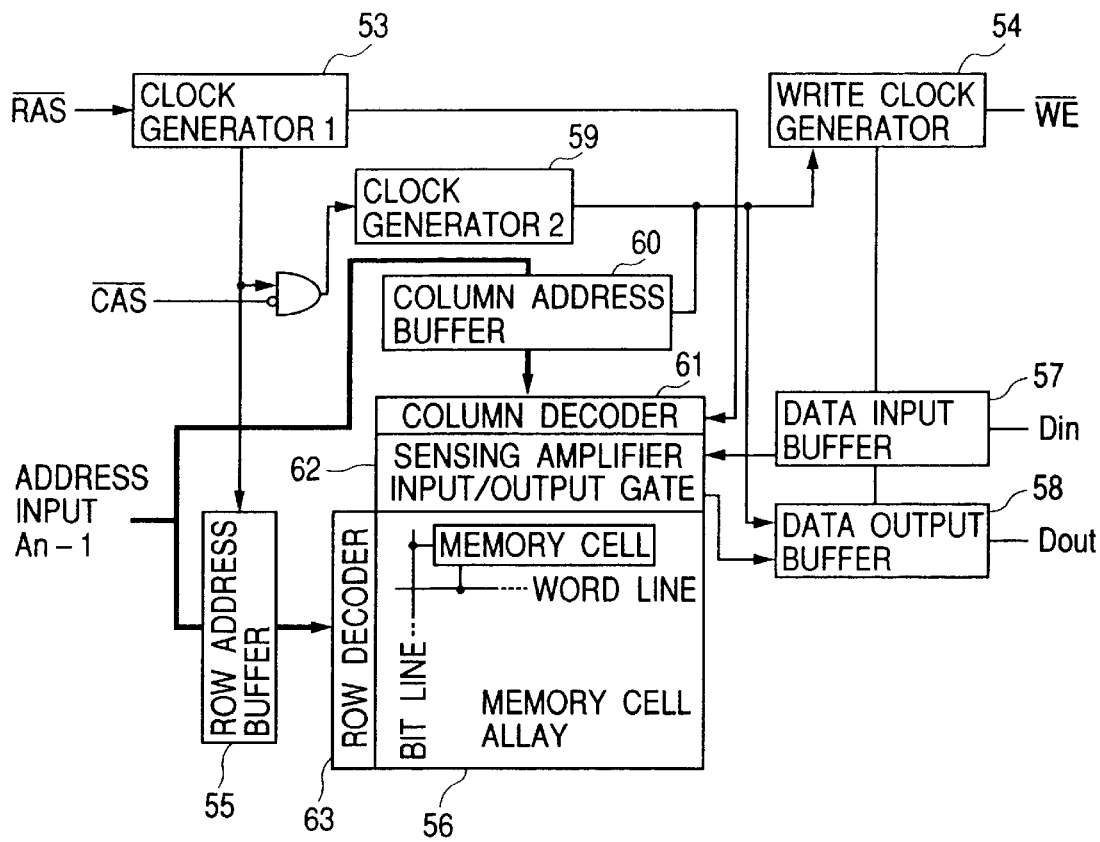
FIG. 38 is a configuration diagram of a dynamic random access memory for explaining the seventeenth embodiment of the present invention.

FIGS. 37 and 38 are a circuit configuration diagram of a semiconductor integrated circuit according to a seventeenth embodiment of the present invention, and a configuration diagram of a dynamic random access memory (referred to as DRAM) for explaining the seventeenth embodiment, respectively. One memory unit (memory cell) forming a main part of a DRAM is fabricated which comprises a fundamental transistor QT forming a transfer circuit and a capacitor CGB that renders body potential of QT variable following word line input, which are fabricated according to the sixteenth embodiment, and further a capacitor CS for memory storage fabricated by a commonly known DRAM fabrication method. Specifically, the memory cell is formed by connecting one semiconductor device QT according to the present invention and one capacitor CS in series with each other, and is connected to a bit line 52, which serves as a data line, and a word line 51 for input/output control. The dynamic random access memory is formed by a memory cell array 56, in which memory cells are disposed so as to form a matrix, and a control periphery circuit, which is also formed by semiconductor integrated circuits according to the first to sixteenth embodiments of the present invention. In order to reduce the number of address signal nodes for memory cell selection, a column address signal and a row address signal are displaced with respect to each other and then multiplexed for application. RAS and CAS each denote a pulse signal and control clock generators 53 and 54, respectively, so that an address signal is distributed to a row decoder 63 and a column decoder 61. A specific word line and a specific bit line are selected by address buffers 57 and 58, which are buffer circuits, according to the address signal distributed to the row decoder 63 and the column decoder 61. Each bit line is connected with a sensing amplifier 62, which is a flip-flop type amplifier. The sensing amplifier 62 amplifies a signal read from a memory cell. A pulse signal WE controls switching between writing and reading by controlling a write enable clock generator. A letter D denotes a write/read signal.

In the semiconductor integrated circuit according to the seventeenth embodiment, not only the control periphery circuit but also the memory cell array is free from floating body effect. In addition, a refresh property of a memory cell, which determines the power consumed by DRAM, represents 0.8 seconds at worst in a 16-megabit memory structure. This represents an improvement by a factor of about 10 over a conventional memory cell. Moreover, as for supplied voltage, the same access time properties as those obtained when a conventional DRAM fabricated on a normal Si substrate is operated at 1.8 V can be achieved at a low supplied voltage of 1.2 V by the DRAM according to the seventeenth embodiment. When access time properties are compared at the same supplied voltage of 1.8 V, the DRAM according to the seventeenth embodiment reduces its access time by 30% or more as compared with a conventional DRAM fabricated on an SOI substrate, thus achieving higher speed operation. Such an increase in operation speed is considered to be a result of an increase in the current of DRAM-forming transistors due to variable threshold effect.

Eighteenth Embodiment

Figure 39:
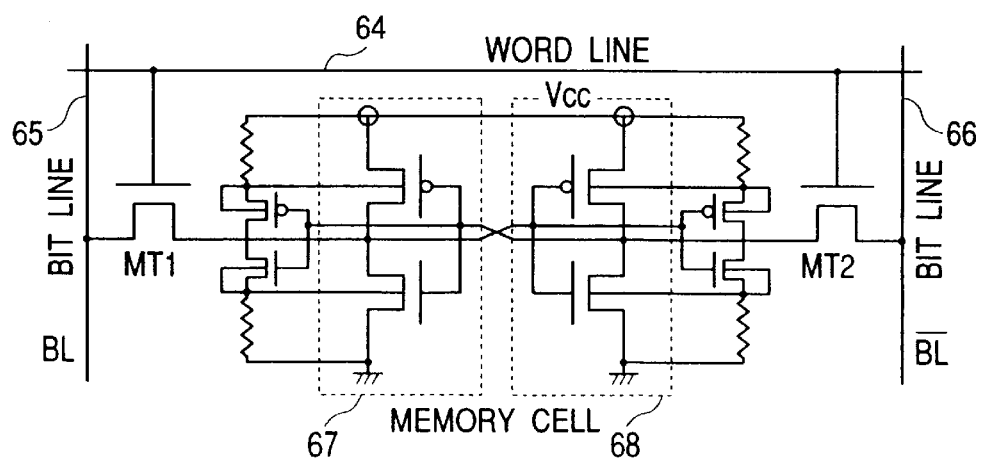
FIG. 39 is a circuit configuration diagram of a static random access memory unit cell according to an eighteenth embodiment of the present invention.
Figure 40:
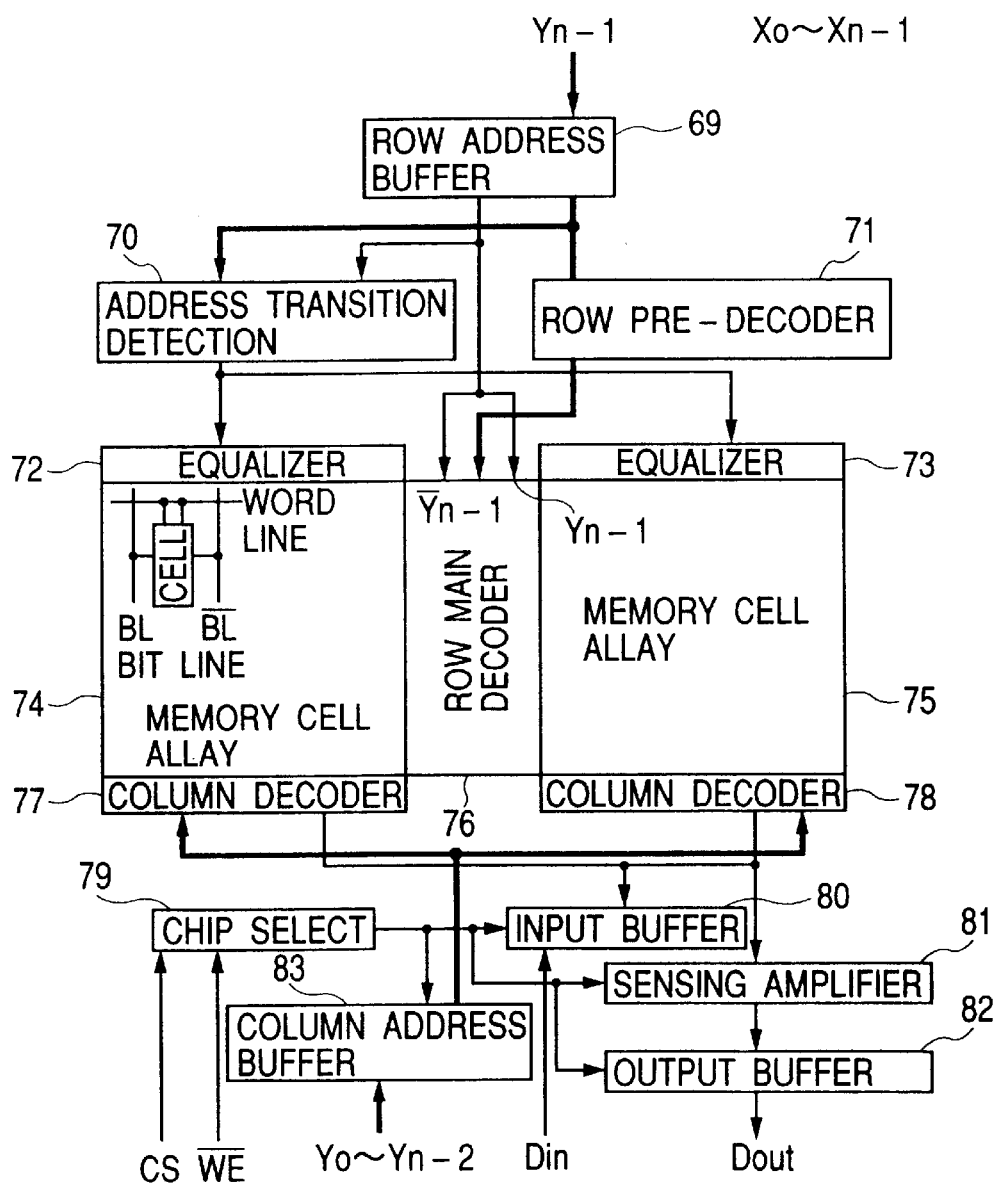
FIG. 40 is a configuration diagram of a static random access memory for explaining the eighteenth embodiment of the present invention.

FIGS. 39 and 40 are a circuit configuration diagram of a semiconductor integrated circuit according to an eighteenth embodiment of the present invention, and a configuration diagram of a static random access memory (referred to as SRAM) for explaining the eighteenth embodiment, respectively. A SRAM including a SRAM memory cell having two sets of inverters as a pair is fabricated according to the fabrication method of the second embodiment.

As shown in FIG. 39, in the SRAM according to the eighteenth embodiment, a memory cell or one memory unit comprises two sets of complementary MOSs according to the present invention and two MOSs for control of signal input/output (referred to as transfer MOSs). The SRAM is formed by a memory cell array 74, in which memory cells 67 and 68 are disposed so as to form a matrix, and a control periphery circuit, which is also formed by semiconductor integrated circuits according to the present invention. The structure of the eighteenth embodiment is basically the same as that of the seventeenth embodiment; however, for higher speed and lower power consumption of the SRAM, an address transition detector 70 is provided, and an internal circuit is controlled by means of a pulse generated by the address transition detector 70. In addition, for higher speed of a circuit from an address buffer 69 to a decoder 78, a row decoder comprises two stages, that is, a pre-decoder 71 and a main decoder 76. Reference numerals 72 and 73 denote equalizers. A chip select 79 is a circuit provided to avoid data contention at the writing and reading of information by signals CS and WE, and achieve higher speed operation by making writing cycle time substantially equal to reading cycle time. Reference numerals 77 and 78 denote column decoders; reference numeral 80 denotes an input buffer; reference numeral 81 denotes a sensing amplifier; reference numeral 82 is an output buffer; and reference numeral 83 denotes a column address buffer.

In FIG. 39, the transfer MOSs MT1 and MT2 are shown as normal nMOS structures; however, the transistor according to the sixteenth embodiment shown in FIG. 36 is more desirable for the formation of the transfer MOSs MT1 and MT2 from viewpoints of integration of fabrication processes, elimination of floating body effect, and lower voltage, higher speed operation. Thus, a SRAM in which transfer MOSs are formed by the transistor according to the sixteenth embodiment is also fabricated.

In FIG. 39, reference numeral 64 denotes a word line; reference numerals 65 and 66 denote bit lines; and reference numerals 67 and 68 denote memory cell regions.

In the semiconductor integrated circuit according to the eighteenth embodiment, various phenomena caused by floating body effect are not observed in pMOS nor nMOS. In addition, as for supplied voltage, the same access time properties as those obtained when a conventional SRAM fabricated on a normal Si substrate is operated at 1.8 V can be achieved at a low supplied voltage of 1.2 V by the SRAM according to the eighteenth embodiment. When access time properties are compared at the same supplied voltage of 1.8 V, the SRAM according to the eighteenth embodiment reduces its access time by 30% or more as compared with a conventional SRAM fabricated on an SOI substrate, thus achieving higher speed operation. Such an increase in operation speed is considered to be a result of an increase in the current of SRAM-forming transistors due to variable threshold effect.

Nineteenth Embodiment

Figure 41:
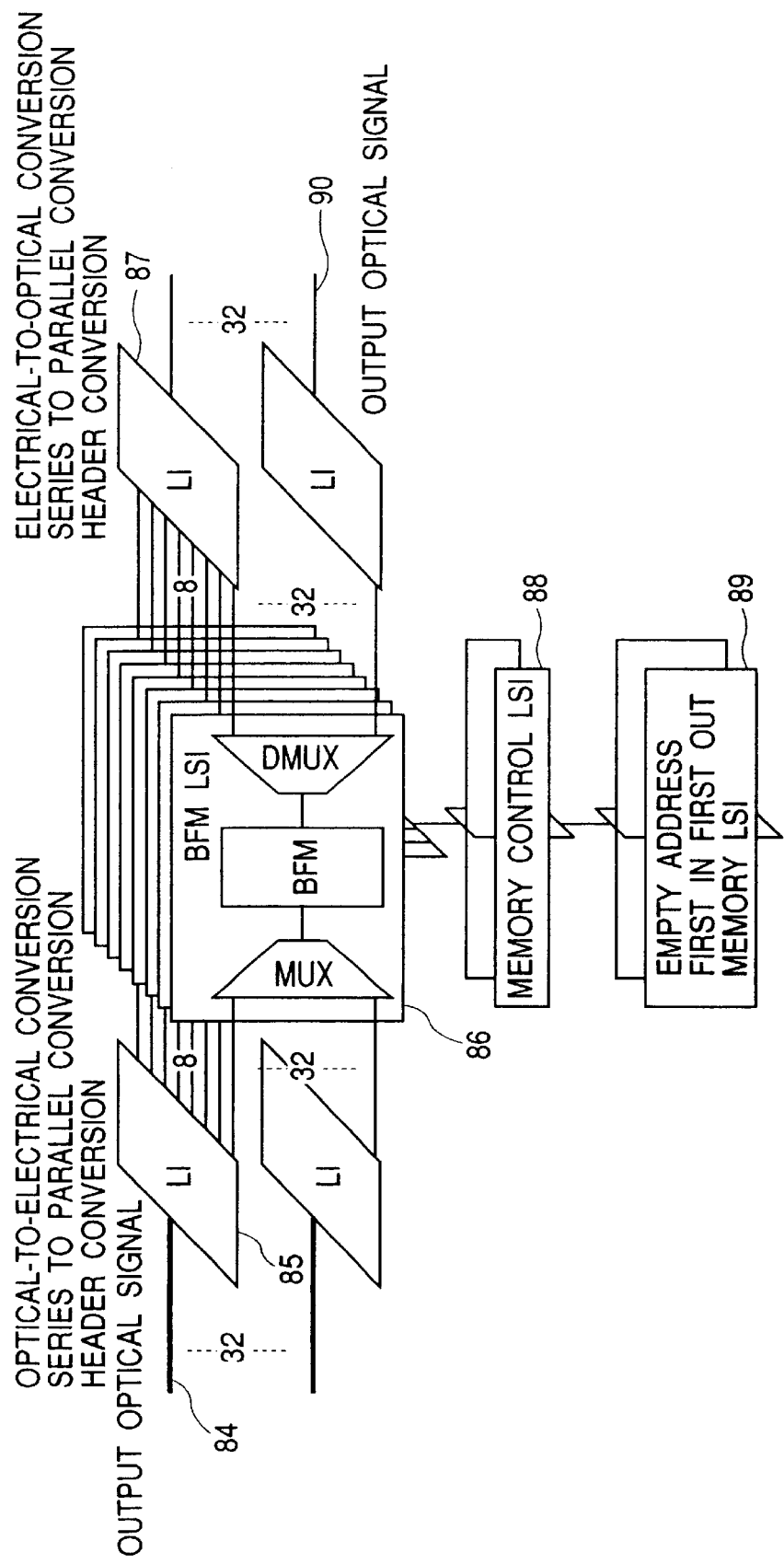
FIG. 41 is a configuration diagram of an asynchronous transfer mode system for explaining a nineteenth embodiment of the present invention.

FIG. 41 is a configuration diagram of a semiconductor integrated circuit according to a further embodiment of the present invention. The nineteenth embodiment relates to a signal transmission processor including semiconductor integrated circuits according to the present invention, and particularly to a signal transmission processor of an asynchronous transfer mode system (referred to as an ATM system). Semiconductor integrated circuits according to the present invention as claimed in claims 1 to 16 and 18 of the present specification are employed.

In FIG. 41, an information signal serially transmitted at a super high speed through an optical fiber 84 is converted into an electric signal by a section denoted by reference numeral 85 in FIG. 41 (optical-to-electrical conversion), and then introduced into a semiconductor integrated circuit (BFMLSI) 86 via a device for series-to-parallel conversion. A semiconductor integrated circuit described in one of the first to eighth embodiments is desirable for use as a BFMLSI 86.

An electric signal after subjected to addressing processing by the semiconductor integrated circuit is subjected to parallel-to-series conversion and electrical-to-optical conversion, and outputted through an optical fiber 90. The BFMLSI comprises a multiplexer (MUX), a buffer memory (BFM), and a demultiplexer (DMUX). The BFMLSI is controlled by a memory control LSI 86 and an LSI having a function of empty address divide control (empty address first-in first-out memory LSI) 89. The signal transmission processor has a function as a switch that transmits a super high-speed transmission signal, which is sent irrespective of an address to be transmitted, to a desired address at a super high speed. Since the operating speed of the BFMLSI is much slower than the transmission speed of an input optical signal, the BFMLSI cannot directly switch the input signal. Therefore, in the BFMLSI system, the input signal is temporarily stored, and the stored signal is switched, converted into super high-speed optical data, and then transmitted to a desired address.

If the operating speed of the BFMLSI is slow, a large storage capacity is required. Since in the ATM system according to the nineteenth embodiment, the BFMLSI is formed by a semiconductor integrated circuit according to the present invention, its operating speed is three times as high as that of a conventional BFMLSI. Thus, it is possible to reduce the storage capacity of the BFMLSI to about ⅓ of that of a conventional BFMLSI. In addition, it is possible to reduce cost of manufacturing the ATM system by applying the present invention.

Twentieth Embodiment

Figure 42:
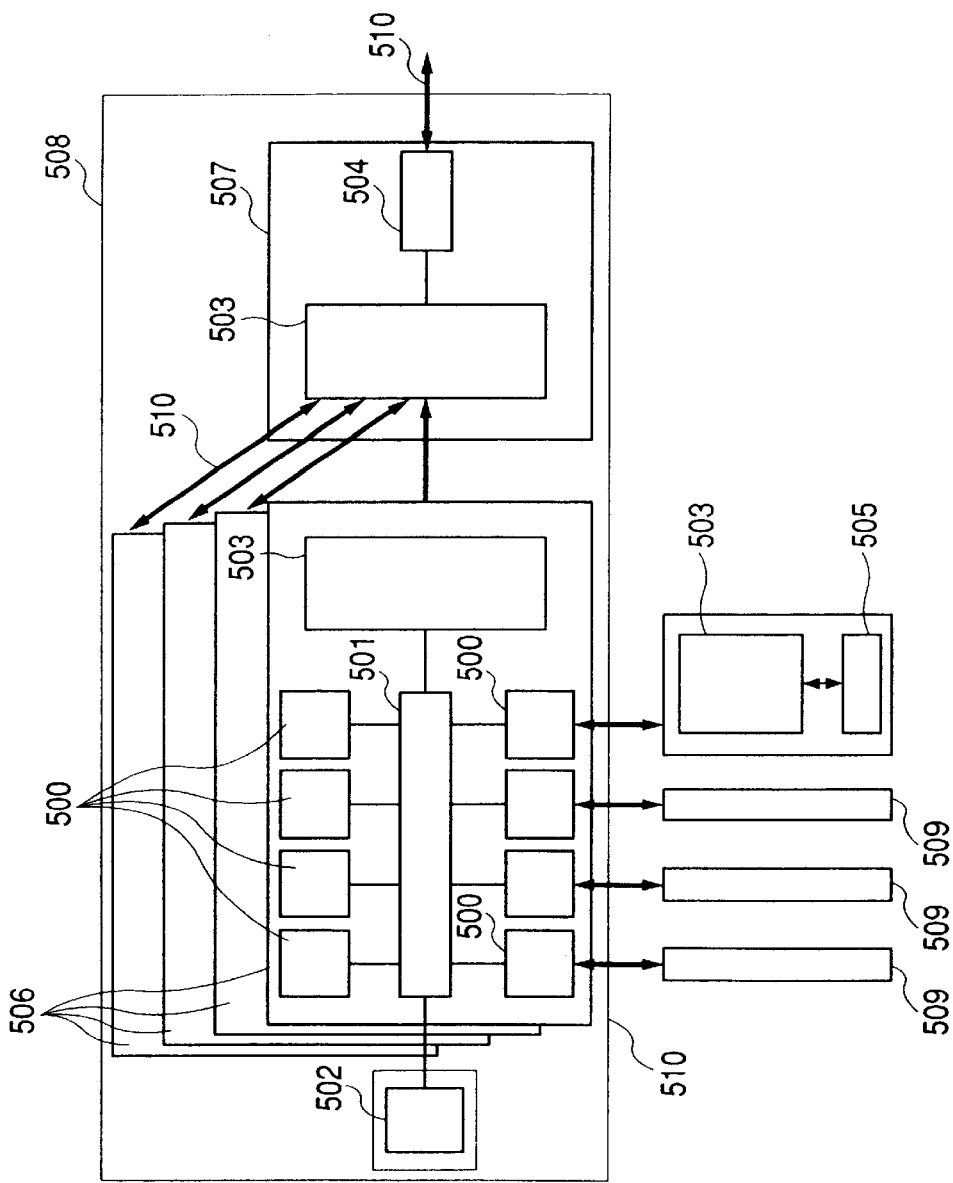
FIG. 42 is a configuration diagram of a computer for explaining a twentieth embodiment of the present invention.

A further embodiment of the present invention will be described with reference to FIG. 42, which is a configuration diagram of a computer. The twentieth embodiment is an example in which semiconductor integrated circuits according to the present invention are applied to a main frame computer. The main frame computer has a plurality of processors 500 for processing instructions and performing operations connected in parallel with each other. Semiconductor integrated circuits according to the present invention as claimed in any one of claims 1 to 18 of the present specification are used.

In the twentieth embodiment, since semiconductor integrated circuits according to the present invention are more highly integrated and less expensive than integrated circuits using conventional bipolar transistors, the processors 500 that process instructions and perform operations, a system control device 501, a main memory 502 and the like are formed by semiconductor integrated circuits according to the present invention whose sides are 10 mm to 30 mm long. Data communication interfaces 503 each comprising the processors 500 that process instructions and perform operations, the system control device 501, and a compound semiconductor device are mounted on a single ceramic substrate 506. Also, a data communication interface 503 and a data communication control device 504 are mounted on a single ceramic substrate 507. The ceramic substrates 506 and 507 and a ceramic substrate mounted with the main memory 502 are mounted on a substrate whose side is about 50 cm or less in length to thereby form a central processor unit 508 of the computer. Data communications within the central processor unit 508, data communications between a plurality of central processor units, or data communications between the central processor unit 508 and a substrate 509 mounted with a data communication interface 503 and an input/output processor 505 are performed via optical fibers 510 denoted by double-headed arrows in FIG. 42.

In the computer of the twentieth embodiment, the semiconductor integrated circuits according to the present invention which form the processors 500 for processing instructions and performing operations, the system control device 501, the main memory 502 and the like make it possible for the computer to reduce its power consumption because of parallel connection and lower voltage, operate at a high speed, and greatly increase the number of instructions processed per second because of data communication by the medium of light.

Twenty-First Embodiment

Figure 43:
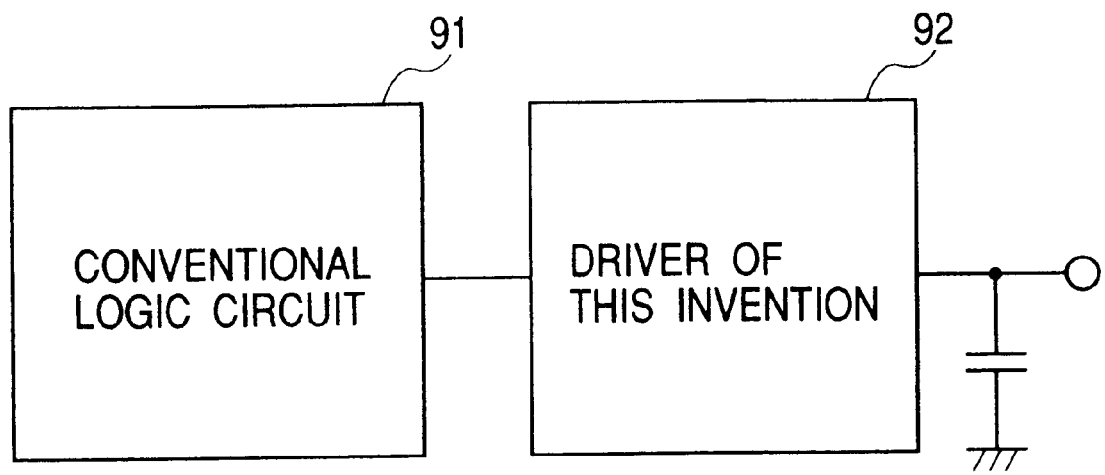
FIG. 43 is a diagram of a circuit configuration including a logic circuit for explaining a twenty-first embodiment of the present invention.

FIG. 43 is a circuit configuration diagram of a further embodiment of the present invention. In the twenty-first embodiment, a semiconductor system is constructed by connecting a semiconductor integrated circuit 92 as claimed in any one of claims 1 to 48 of the present invention with a semiconductor integrated circuit 91 of a conventional structure in which body potential is not controlled. The body potential of the semiconductor integrated circuit of the conventional structure is not controlled. FIG. 43 shows an example in which a driver of this invention is used in a section for driving a load capacitance, and a logic circuit section is formed by the semiconductor integrated circuit of the conventional structure; however, the semiconductor integrated circuit according to the present invention may be connected in opposite connecting relation to or in parallel with the semiconductor integrated circuit of the conventional structure. In any case, the semiconductor integrated circuit according to the present invention is used only in a circuit section where low power consumption and high speed operation properties are required, while a conventional circuit structure such as an ultra-large scale circuit is used in a circuit section where an area added by the circuit needs to be reduced to a minimum. Thus, it is possible to construct a semiconductor system with an ultra-large scale semiconductor integrated circuit that achieves both super high speed operation and super low power consumption. It should be understood that the conventional circuit structure does not need to be limited at all to use for the logic circuit; the conventional circuit structure may also be used for a memory circuit, an analog circuit, and the like. In addition, these conventional circuits are not limited to semiconductor integrated circuits formed by MOS field effect transistors; the conventional circuits may be formed by bipolar transistors.

[Supplements Relating to the Present Invention]

The 20 embodiments of the present invention described above provide examples in which a resistor or a subsidiary transistor having a function of extracting accumulated charge from a body node of a fundamental transistor is formed integrally with the fundamental transistor in the same semiconductor region. However, if desired because of fabrication method or system configuration, the resistor or the subsidiary transistor may be formed separately, rather than integrally with the fundamental transistor, by a fabrication process so as to function in the same manner as the structure of the present invention as an equivalent circuit, and may thereafter be connected to the fundamental transistor to complete a semiconductor integrated circuit. It is to be understood that a resistor formed in an SOI layer region between the bottom of a source junction and a buried insulator, in particular, may be formed by the same fabrication method as that of a conventional semiconductor integrated circuit by a polycrystalline semiconductor layer and the like in a region on a semiconductor substrate, without departing from the spirit and the scope of the present invention.

In the embodiments of the present invention described above, semiconductor integrated circuits formed in a single crystalline semiconductor (SOI) layer isolated from a supporting substrate by a buried insulator are described. This is because it is extremely easy to isolate basic units of a semiconductor device or a semiconductor integrated circuit whose threshold voltage is to be made variable and make the isolated basic units function independently of each other, and because of its advantage of minimizing increase in occupied area. However, depending on the scale of a system to which the present invention is applied, basic units of a semiconductor device or a semiconductor integrated circuit whose threshold voltage is to be made variable may be isolated from each other by using so-called well isolation by a p-n junction isolation formed within a conventional semiconductor substrate instead of an SOI layer, without departing from the spirit of the present invention.

According to the present invention, the threshold voltage of an SOI·MOS transistor can be made variable in such a manner that more current flows in a conducting state and leakage current is further reduced in a non-conducting state, without creating an undesirable leakage current path such as a gate-source current path. Therefore, the present invention makes it possible to achieve greater current properties in low voltage operation as compared with a conventional SOI·MOS transistor.

In addition, the present invention is applicable to a wide range of semiconductor integrated circuits ranging from single transistors to inverters, transfer circuits, NAND circuits, NOR circuits, SRAMs and DRAMs, thus making it possible to achieve lower voltage, lower power consumption, and higher speed operation of the whole system.

Moreover, according to the present invention, since body potential is controlled to a desired potential in response to both direct-current input and pulse input, it is possible to avoid variations in threshold voltage, appearance of abnormal hump properties in current-voltage properties, decrease in source-to-drain withstand voltage and other phenomena caused by floating body effect, which has been the greatest disadvantage of a semiconductor device formed on an SOI substrate, without basically changing the existing fabrication method for semiconductor devices. Since there is basically no need to change the fabrication method, it is possible to obtain a great advantage of being able to fabricate semiconductor integrated circuits at low cost. Thus, according to the present invention, it is possible to completely eliminate floating body effect in CMOS on an SOI substrate by an inexpensive fabrication method.

INDUSTRIAL APPLICABILITY

According to the present invention, it is possible to provide SOI·MOS that has variable threshold voltage properties and enables lower voltage operation while ensuring high speed operation.

According to the present invention, it is possible to provide desired semiconductor integrated circuits having the properties described above by an inexpensive fabrication method.

What is claimed is:

1. A semiconductor integrated circuit comprising:
   a supporting substrate having at least a first substrate region arid a second substrate region electrically isolated from each other;
   a first MOS field effect transistor and a second MOS field effect transistor which form said first substrate region; and
   a third MOS field effect transistor and a fourth MOS field effect transistor which form said second substrate region;
   wherein a single nit semiconductor device is formed by at least said first to fourth MOS field effect transistors; and
   a circuit configuration is formed by a semiconductor device group including at least said single unit semiconductor device, said second MOS field effect transistor including a gate electrode connected to a gate electrode of said first MOS field effect transistor; a drain connected to a drain of said first MOS field effect transistor; and a source connected to a source of said first MOS field effect transistor via a first resistor and a body node of said first MOS field effect transistor; and said fourth MOS field effect transistor including a gate electrode connected to a gate electrode of said third MOS field effect transistor; a drain connected to a drain of said third MOS field effect transistor; and a source connected to a source of said third MOS field effect transistor via a second resistor and a body node of said third MOS field effect transistor.

2. A semiconductor integrated circuit device comprising:
   a supporting substrate having at least a first substrate region and a second substrate region electrically isolated from each other;
   a first MOS field effect transistor of a first conduction type and a first capacitor which are formed in said first substrate region; and
   a second MOS field effect transistor of a second conduction type and a second capacitor which are formed in said second substrate region;
   wherein a single unit semiconductor device is formed by at least said first and second MOS field effect transistors and said first and second capacitors; and
   a circuit configuration is formed by a semiconductor device group including at least said single unit semiconductor device, said first capacitor including one electrode connected to a gate electrode of said MOS field effect transistor; and another electrode connected to a source of said first MOS field effect transistor via a first resistor and a body node of said first MOS field effect transistor; and said second capacitor including one electrode connected to a gate electrode of said second MOS field effect transistor; and another electrode connected to a source of said first MOS field effect transistor via a second resistor and a body node of said first MOS field effect transistor.

3. A semiconductor integrated circuit formed on at least a first substrate region and a second substrate region electrically insolated from each other and formed on a supporting substrate, comprising:
   a first MOS field effect transistor of a first conduction type, a second MOS field effect transistor of the first conduction type, and a third MOS field effect transistor of a second conduction type which are formed in said first substrate region; and a fourth MOS field effect transistor of the second conduction type, a fifth MOS field effect transistor of the second conduction type, and a sixth MOS field effect transistor of the first conduction type which are formed in said second substrate region;

wherein a single unit semiconductor device is formed by at least said first to sixth MOS field effect transistors; and a circuit configuration is formed by a semiconductor device group including at least said single unit semiconductor device, gate electrodes of said first MOS field effect transistor and said fourth MOS field effect transistor being connected to a data input node; drains of said first MOS field effect transistor and said fourth MOS field effect transistor being connected to an output node; a source of said first MOS field effect transistor being connected to an earth line; a source of said fourth MOS field effect transistor being connected to a power supply line; a drain of said second MOS field effect transistor being connected to an output node; sources of said second MOS field effect transistor and said third MOS field effect transistor being connected to a body node of said first MOS field effect transistor; a drain of said third MOS field effect transistor being connected to the earth line; sources of said fifth MOS field effect transistor and said sixth MOS field effect transistor being connected to a body node of said fourth MOS field effect transistor; a drain off said fifth MOS field effect transistor being connected to the output node; a drain of said sixth MOS field effect transistor being connected to the power supply line; and gate electrodes of said second MOS field effect transistor, said third MOS field effect transistor, said fifth MOS field effect transistor, and said sixth MOS field effect transistor being connected to the input node.

4. A semiconductor integrated circuit formed on at least a first substrate region and a second substrate region electrically isolated from each other and formed on a supporting substrate, comprising:

a first MOS field effect transistor of a first conduction type, a second MOS field effect transistor of the first conduction type, and a third MOS field effect transistor of the first conduction type which form said first substrate region; and a fourth MOS field effect transistor of a second conduction type, a fifth MOS field effect transistor of the second conduction type, and a sixth MOS field effect transistor of the second conduction the which form said second substrate region;

wherein a single Unit semiconductor device is formed by at least said first to sixth MOS field effect transistors; and a circuit configuration is formed by a semiconductor device group including at least said single unit semiconductor device, gate electrodes of said first MOS field effect transistor and said fourth MOS field effect transistor being connected to a data input node; drains of said first MOS field effect transistor and said fourth MOS field effect transistor being connected to an output node; a source of said first MOS field effect transistor being connected to an earth line; a source of said fourth MOS field effect transistor being connected to a power supply line; a drain of said second MOS field effect transistor being connected to an output node; sources of said second MOS field effect transistor and said third MOS field effect transistor being connected to a body node of said first MOS field effect transistor; a drain of said third MOS field effect transistor being connected to the earth line; sources of said fifth MOS field effect transistor and said sixth MOS field effect transistor being connected to a body node of said fourth MOS field effect transistor; a drain of said fifth MOS field effect transistor being connected to the output node; a drain of said sixth MOS field effect transistor being connected to the power supply line; gate electrodes of said second MOS field effect transistor and said fifth MOS field effect transistor being connected to the input node; and gate electrodes of said third MOS field effect transistor and said sixth MOS field effect transistor being connected to the output node.

5. A semiconductor integrated circuit as claimed in claim 1, wherein said semiconductor device is isolated from the supporting substrate of the semiconductor integrated circuit by an insulator, and is isolated from another semiconductor device by an insulator.

6. A semiconductor integrated circuit as claimed in claim 2, wherein said semiconductor device is isolated from the supporting substrate of the semiconductor integrated circuit by an insulator, and is isolated from another semiconductor device by an insulator.

7. A semiconductor integrated circuit as claimed in claim 3, wherein said semiconductor device is isolated from the supporting substrate of the semiconductor integrated circuit by an insulator, and is isolated from another semiconductor device by an insulator.

8. A semiconductor integrated circuit as claimed in claim 3, wherein said semiconductor device is isolated from the supporting substrate of the semiconductor integrated circuit by an insulator, and is isolated from another semiconductor device by an insulator.

9. A semiconductor integrated circuit as claimed in claim 1, wherein absolute values of threshold voltages of said second transistor and said fourth transistor are set lower than absolute values of threshold voltages of said first transistor and said third transistor.

10. A semiconductor integrated circuit as claimed in claim 3, wherein absolute values of threshold voltages of said second transistor, said third transistor, said fifth transistor, and said sixth transistor are set lower than absolute values of threshold voltages of said first transistor and said fourth transistor.

11. A semiconductor integrated circuit as claimed in claim 1, wherein channel widths of said second transistor and said fourth transistor are ⅕ or less of channel widths of said first transistor and said third transistor.

12. A semiconductor integrated circuit as claimed in claim 3, wherein channel widths of said second transistor, said third transistor, said fifth transistor, and said sixth transistor are ⅕ or Less of channel widths of said first transistor and said fourth transistor.

13. A semiconductor integrated circuit as claimed in claim 1,
wherein two pairs of semiconductor integrated circuits form a single unit memory.

14. A semiconductor integrated circuit as claimed in claim 1, wherein said resistor is formed by a resistive functional device having linear or nonlinear properties, and a resistance value of said resistor is set higher than on resistances of the first transistor and the third transistor.

* * * * *

UNITED STATES PATENT AND TRADEMARK OFFICE
CERTIFICATE OF CORRECTION

PATENT NO. : 6,646,296 B2
DATED : November 11, 2003
INVENTOR(S) : M. Horiuchi

It is certified that error appears in the above-identified patent and that said Letters Patent is hereby corrected as shown below:

Title page,
Item [62], Related U.S. Application Data, please correct to read as follows:
-- Division of application No. 09/743,238, filed as application No. PCT/JP99/03622 on Jul. 5, 1999, now Pat. No. 6,462,364. --

Signed and Sealed this

Sixth Day of April, 2004

JON W. DUDAS
*Acting Director of the United States Patent and Trademark Office*